(12) United States Patent
Prahlad et al.

(10) Patent No.: US 11,203,123 B2
(45) Date of Patent: Dec. 21, 2021

(54) METHODS AND SYSTEMS FOR COMBINED NEGATIVE PRESSURE AND ELECTROADHESION-BASED MANIPULATION IN MANUFACTURING

(71) Applicant: GRABIT, INC., Sunnyvale, CA (US)

(72) Inventors: Harsha Prahlad, Cupertino, CA (US); Richard J. Casler, Los Gatos, CA (US); Susan Kim, Menlo Park, CA (US); Matthew Leettola, San Jose, CA (US); Jon Smith, San Jose, CA (US); Kenneth Tan, San Jose, CA (US); Patrick Wang, San Jose, CA (US); John Mathew Farren, Beaverton, OR (US); Patrick Conall Regan, Beaverton, OR (US); Po Cheng Chen, Taichung (TW); Honam Ko, Taichung (TW); Dragan Jurkovic, Beaverton, OR (US); Aishwarya Varadhan, Beaverton, OR (US); Tsung Tai Chien, Taichung (TW); Chang-Chu Liao, Douliu (TW); Chih-Chi Chang, Douliu (TW); Kuo-Hung Lee, Douliu (TW); TaeHoun Kim, Busan (KR)

(73) Assignee: Grabit, Inc., Ada, MI (US)

( * ) Notice: Subject to any disclaimer, the term of this patent is extended or adjusted under 35 U.S.C. 154(b) by 0 days.

(21) Appl. No.: 16/030,707

(22) Filed: Jul. 9, 2018

(65) Prior Publication Data

US 2018/0319020 A1    Nov. 8, 2018

Related U.S. Application Data

(63) Continuation of application No. PCT/US2017/013266, filed on Jan. 12, 2017.

(Continued)

(51) Int. Cl.
*B25J 15/00* (2006.01)
*B25J 15/06* (2006.01)
(Continued)

(52) U.S. Cl.
CPC ......... *B25J 15/0085* (2013.01); *B23P 19/007* (2013.01); *B25J 9/0093* (2013.01);
(Continued)

(58) Field of Classification Search
CPC .. B25J 15/0085; B25J 15/0616; B25J 9/0093; B25J 9/0096; B25J 9/1697;
(Continued)

(56) References Cited

U.S. PATENT DOCUMENTS 3,480,174 A    11/1969   Sherwood et al.
3,797,691 A    3/1974    Williams et al.
(Continued)

FOREIGN PATENT DOCUMENTS

CN    203889500 U    10/2014
CN    203911809 U    10/2014
(Continued)

OTHER PUBLICATIONS

Translation of DE10319272 (Year: 2004).*
(Continued)

*Primary Examiner* — Matthew P Travers
(74) *Attorney, Agent, or Firm* — Gardner, Linn, Burkhart & Ondersma LLP

(57) ABSTRACT

Systems, apparatus, and methods of manufacturing an article using electroadhesion technology, either as a sole modality of handling such materials or in concert with vacuum for the pick up and release of materials, respectively.

12 Claims, 15 Drawing Sheets

Related U.S. Application Data

(60) Provisional application No. 62/277,756, filed on Jan. 12, 2016.

(51) Int. Cl.

| | | |
|---|---|---|
| *B25J 9/16* | (2006.01) | |
| *B23P 19/00* | (2006.01) | |
| *A43D 111/00* | (2006.01) | |
| *B23P 21/00* | (2006.01) | |
| *B25J 9/00* | (2006.01) | |
| *B25J 19/02* | (2006.01) | |
| *B32B 37/18* | (2006.01) | |
| *H02N 13/00* | (2006.01) | |
| *H01L 21/683* | (2006.01) | |
| *B32B 38/18* | (2006.01) | |

(52) U.S. Cl.
CPC .......... *B25J 9/0096* (2013.01); *B25J 9/1697* (2013.01); *B25J 15/0052* (2013.01); *B25J 15/065* (2013.01); *B25J 15/0616* (2013.01); *B25J 15/0666* (2013.01); *B25J 19/023* (2013.01); *B32B 37/18* (2013.01); *H02N 13/00* (2013.01); *A43D 111/003* (2013.01); *B23P 21/00* (2013.01); *B32B 2038/1891* (2013.01); *B32B 2309/70* (2013.01); *H01L 21/6831* (2013.01); *H01L 21/6833* (2013.01)

(58) Field of Classification Search
CPC ...... H01L 21/6831–6833; B23P 19/007; B23P 21/002–21/004; B25H 1/00; B25H 1/0092; B25H 1/20; B32B 37/18; B32B 38/18; B32B 2038/1891; B32B 39/00; B32B 2309/70; D06M 17/00
See application file for complete search history.

(56) References Cited

U.S. PATENT DOCUMENTS

| | | | |
|---|---|---|---|
| 4,723,353 A | 2/1988 | Monforte | |
| 4,856,769 A | 8/1989 | Andrew et al. | |
| 5,207,313 A | 5/1993 | Gebhardt | |
| 5,532,903 A | 7/1996 | Kendall | |
| 5,765,707 A | 6/1998 | Kenevan | |
| 5,883,357 A | 3/1999 | Newman et al. | |
| 6,123,185 A | 9/2000 | Demarest et al. | |
| 6,548,982 B1 | 4/2003 | Papanikolopoulos et al. | |
| 6,622,063 B1 | 9/2003 | Moritz et al. | |
| 6,721,762 B1 | 4/2004 | Levine et al. | |
| 7,034,432 B1 | 4/2006 | Pelrine et al. | |
| 7,598,651 B2 | 10/2009 | Kornbluh et al. | |
| 9,987,755 B2 | 6/2018 | Prahlad et al. | |
| 2001/0045755 A1 | 11/2001 | Schick et al. | |
| 2004/0045963 A1 | 3/2004 | Hoogland | |
| 2004/0146380 A1 | 7/2004 | Baker et al. | |
| 2004/0162639 A1 | 8/2004 | Watanabe et al. | |
| 2005/0036873 A1 | 2/2005 | Ikehata et al. | |
| 2007/0005180 A1 | 1/2007 | Stingel, III et al. | |
| 2007/0271857 A1 | 11/2007 | Heather et al. | |
| 2008/0089002 A1 | 4/2008 | Pelrine et al. | |
| 2010/0018964 A1 | 1/2010 | Smith | |
| 2010/0147842 A1 | 6/2010 | Reynard et al. | |
| 2010/0178139 A1 | 7/2010 | Sundar et al. | |
| 2010/0194012 A1* | 8/2010 | Tatsumi ............... | B65G 49/061 269/21 |
| 2010/0249553 A1 | 9/2010 | MacLaughlin | |
| 2011/0193362 A1 | 8/2011 | Prahlad et al. | |
| 2011/0202157 A1 | 8/2011 | Spikker | |
| 2012/0024740 A1 | 2/2012 | Gollnick et al. | |
| 2012/0101627 A1 | 4/2012 | Lert | |
| 2012/0120544 A1 | 5/2012 | Pelrine et al. | |
| 2012/0181270 A1 | 7/2012 | Smith | |
| 2012/0330453 A1 | 12/2012 | Samak et al. | |
| 2013/0010398 A1 | 1/2013 | Prahlad et al. | |
| 2013/0125319 A1 | 5/2013 | Regan | |
| 2013/0129464 A1 | 5/2013 | Regan et al. | |
| 2013/0149485 A1 | 6/2013 | Furukawa et al. | |
| 2013/0242455 A1 | 9/2013 | Prahlad et al. | |
| 2013/0276826 A1 | 10/2013 | Koenig et al. | |
| 2013/0292303 A1 | 11/2013 | Prahlad et al. | |
| 2013/0294875 A1 | 11/2013 | Prahlad et al. | |
| 2014/0008359 A1 | 1/2014 | Ferren | |
| 2014/0036404 A1 | 2/2014 | Prahlad et al. | |
| 2014/0104744 A1 | 4/2014 | Prahlad et al. | |
| 2014/0241844 A1 | 8/2014 | Golda et al. | |
| 2015/0176981 A1 | 6/2015 | Regan et al. | |
| 2015/0295206 A1 | 10/2015 | Hsieh | |
| 2015/0298320 A1 | 10/2015 | Eisele et al. | |
| 2015/0314583 A1 | 11/2015 | Jess et al. | |
| 2016/0318190 A1 | 11/2016 | Prahlad et al. | |
| 2017/0036798 A1 | 2/2017 | Prahlad et al. | |
| 2018/0250832 A1 | 9/2018 | Prahlad et al. | |
| 2018/0319019 A1 | 11/2018 | Prahlad et al. | |
| 2018/0326596 A1 | 11/2018 | Prahlad et al. | |

FOREIGN PATENT DOCUMENTS

| | | | | |
|---|---|---|---|---|
| CN | 203990927 U | 12/2014 | | |
| CN | 104718609 A | 6/2015 | | |
| DE | 10319272 A1 * | 11/2004 | ......... | H01L 21/6838 |
| DE | 102009011302 A1 | 9/2010 | | |
| DE | 102011051585 A1 | 1/2013 | | |
| DE | 102013220107 A1 | 4/2015 | | |
| EP | 1473764 A2 | 11/2004 | | |
| JP | S58104806 A | 6/1983 | | |
| JP | H0539885 U | 5/1993 | | |
| JP | H07116984 A | 5/1995 | | |
| JP | H09269995 A | 10/1997 | | |
| JP | 2000286543 A | 10/2000 | | |
| JP | 2003285289 A | 10/2003 | | |
| JP | 2004142878 A | 5/2004 | | |
| JP | 2005035751 A | 2/2005 | | |
| JP | 2007222967 A | 9/2007 | | |
| JP | 2009166859 A | 7/2009 | | |
| JP | 2012131612 A | 7/2012 | | |
| JP | 2013037538 A | 2/2013 | | |
| KR | 20110078566 A | 7/2011 | | |
| KR | 20130130405 A | 12/2013 | | |
| WO | WO-2007128398 A1 | 11/2007 | | |
| WO | WO-2013166317 A2 | 11/2013 | | |
| WO | WO-2013166324 A2 | 11/2013 | | |
| WO | WO-2015094375 A1 | 6/2015 | | |
| WO | WO-2015095826 A1 | 6/2015 | | |
| WO | WO-2015142754 A1 | 9/2015 | | |
| WO | WO-2015142911 A1 | 9/2015 | | |
| WO | WO-2015164264 A1 | 10/2015 | | |
| WO | WO-2016054561 A1 | 4/2016 | | |
| WO | WO-2017123816 A1 | 7/2017 | | |
| WO | WO-2017123817 A1 | 7/2017 | | |
| WO | WO-2017123818 A1 | 7/2017 | | |
| WO | WO-2018071722 A1 | 4/2018 | | |

OTHER PUBLICATIONS

U.S. Appl. No. 15/105,941 Office Action dated Sep. 21, 2018.
PCT/US2013/077280 International Preliminary Report on Patentability dated Jun. 30, 2016.
PCT/US2013/077280 International Search Report and Written Opinion dated Oct. 2, 2014.
PCT/US2014/071725 International Preliminary Report on Patentability dated Jun. 30, 2016.
PCT/US2014/071725 International Search Report and Written Opinion dated Apr. 16, 2015.
PCT/US2015/020805 International Preliminary Report on Patentability dated Sep. 29, 2016.
PCT/US2015/020805 International Search Report and Written Opinion dated Jul. 20, 2015.
PCT/US2015/021051 International Preliminary Report on Patentability dated Sep. 29, 2016.
PCT/US2015/021051 International Search Report and Written Opinion dated Sep. 3, 2015.

(56) References Cited

OTHER PUBLICATIONS

PCT/US2015/026679 International Preliminary Report on Patentability dated Nov. 3, 2016.
PCT/US2015/026679 International Search Report and Written Opinion dated Aug. 27, 2015.
PCT/US2017/013262 International Preliminary Report on Patentability dated Jul. 26, 2018.
PCT/US2017/013262 International Search Report and Written Opinion dated May 24, 2017.
PCT/US2017/013262 Invitation to Pay Additional Fees dated Mar. 20, 2017.
PCT/US2017/013264 International Preliminary Report on Patentability dated Jul. 26, 2018.
PCT/US2017/013264 International Search Report and Written Opinion dated May 16, 2017.
PCT/US2017/013266 International Search Report and Written Opinion dated Apr. 3, 2017.
PCT/US2017/056413 International Search Report and Written Opinion dated Jan. 12, 2018.
U.S. Appl. No. 15/126,709 Office Action dated Jul. 11, 2017.
U.S. Appl. No. 15/105,941 Office Action dated Jun. 28, 2019.
U.S. Appl. No. 15/299,984 Office Action dated Aug. 21, 2019.

* cited by examiner

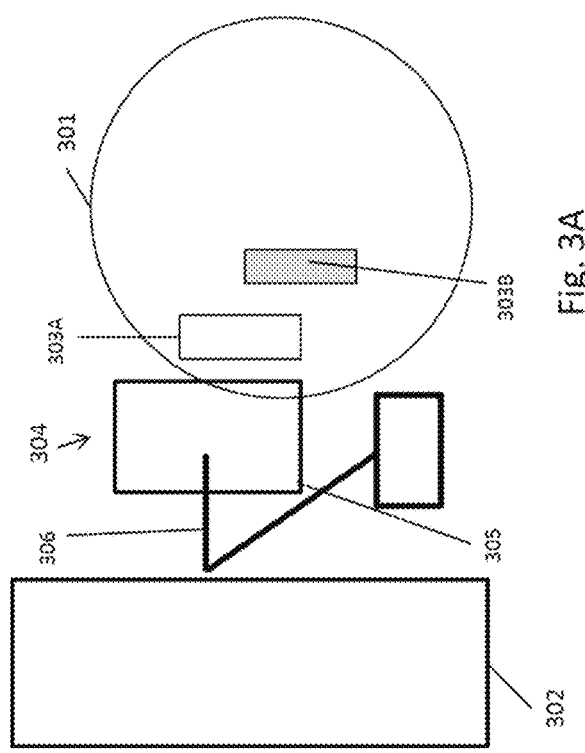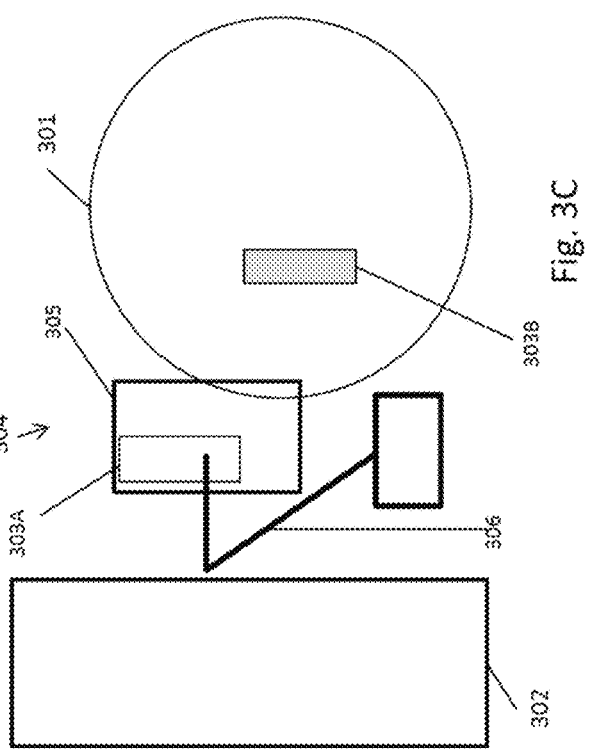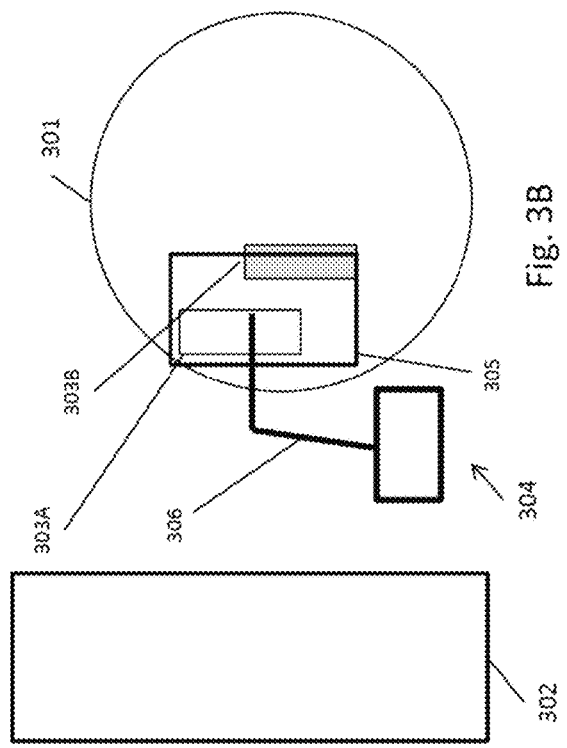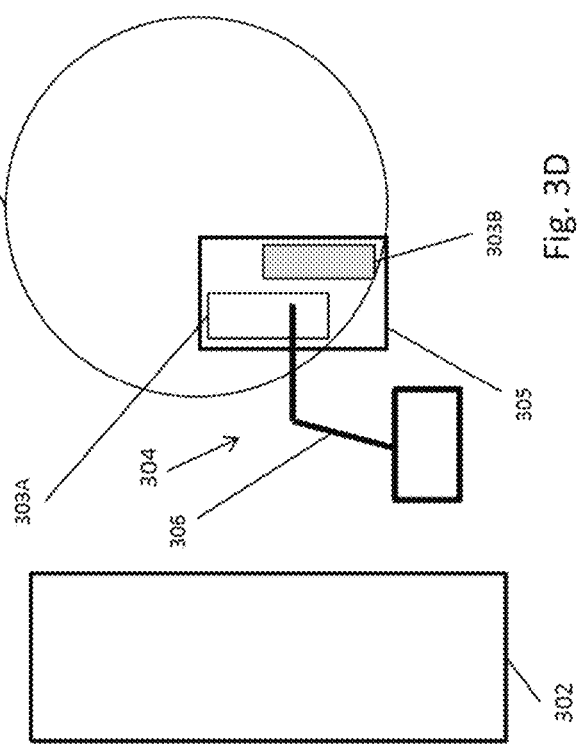

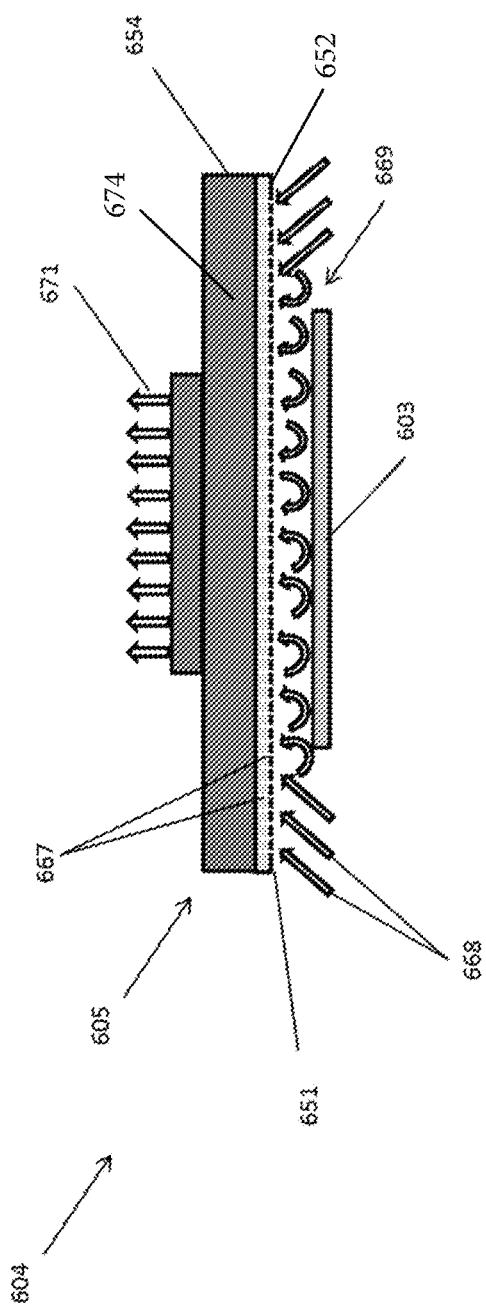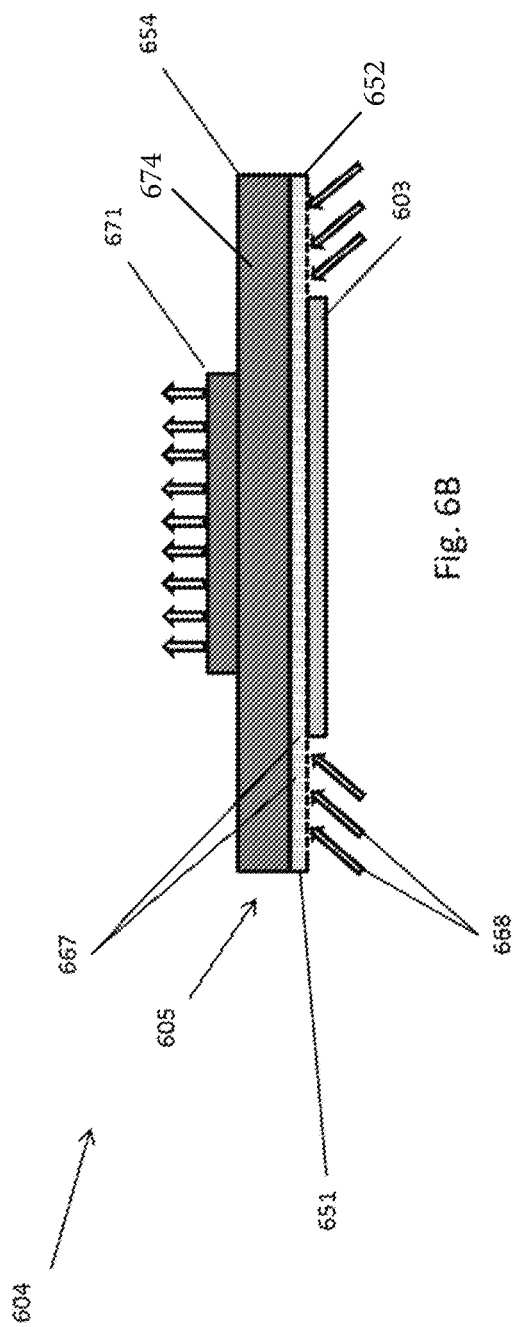

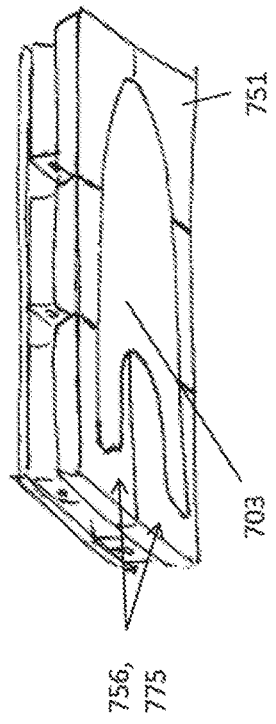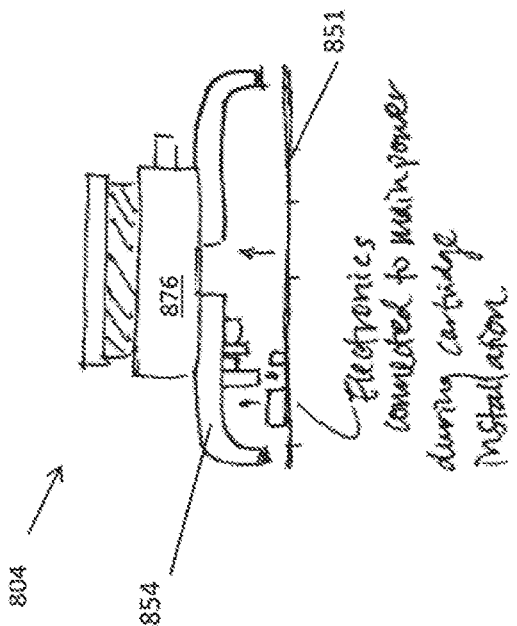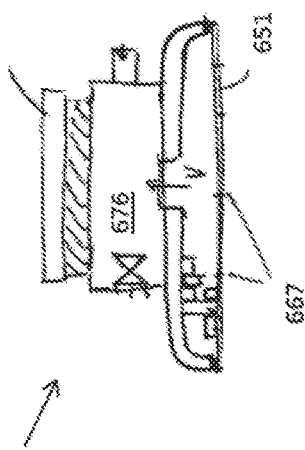

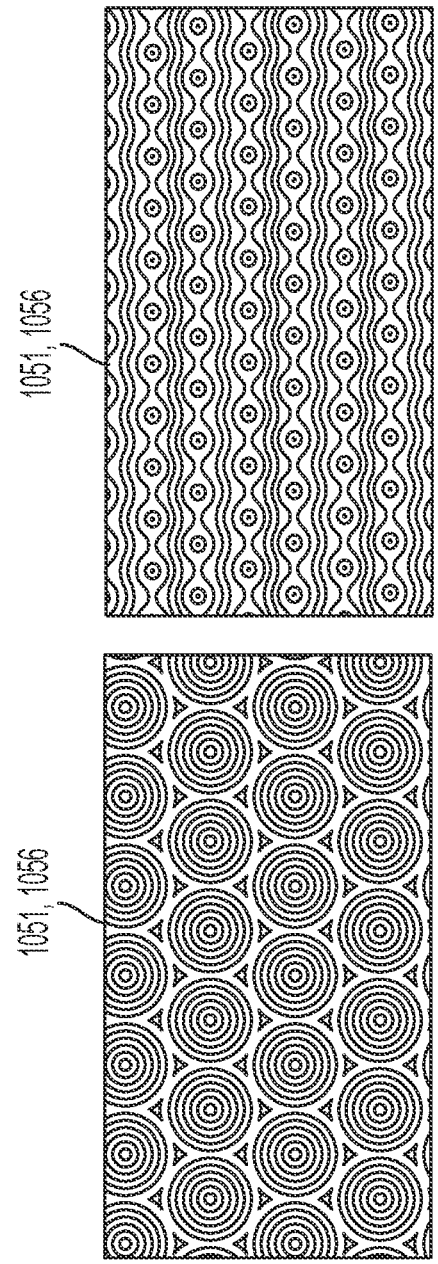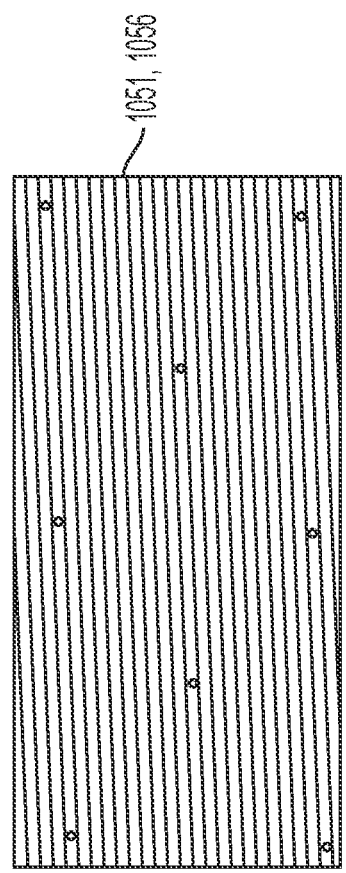

Step 1101: Capture 1st article component with 1st zone and 2nd article component with 2nd zone
    1101A: Activate electroadhesion
    1101B: Apply negative pressure
Step 1102: Detect capture of 1st article with 1st pressure sensor
Step 1103: Detect capture of 2nd article component with 2nd pressure sensor
Step 1104: Release 1st article component; retain 2nd article component
    1104A: Cease negative pressure
    1104B: Apply positive pressure
    1104C: Separate netting
Step 1105: Detect release of 1st article component with 1st pressure sensor
Step 1106: Detect retention of 2nd article component with 2nd pressure sensor
Step 1107: Release 2nd article
Step 1108: Detect release of 2nd article component with 2nd pressure sensor
Step 1109: Repeat for multiple article components

Step 1201: Place capture element over 1st article component
    1201A: Move robot arm
    1201B: Align capture element to 1st pre-determined capture location
Step 1202: Capture 1st article component with 1st zone
    1202A: Activate electroadhesion
    1202B: Apply negative pressure
Step 1203: Place capture element over 2nd article component
    1203A: Move robot arm
    1203B: Align capture element to 2nd pre-determined capture location
Step 1204: Capture 2nd article component with 2nd zone
    1204A: Activate electroadhesion
    1204B: Apply negative pressure
Step 1205: Move article components over 2nd platform
    1205A: Move robot arm
    1205B: Align capture element to 1st pre-determined location
Step 1206: Release 1st article component; retain 2nd article component
    1206A: Cease negative pressure
    1206B: Apply positive pressure
    1206C: Separate netting
Step 1207: Release 2nd article component
Step 1208: Repeat for multiple article components

Fig. 12

METHODS AND SYSTEMS FOR COMBINED NEGATIVE PRESSURE AND ELECTROADHESION-BASED MANIPULATION IN MANUFACTURING

CROSS-REFERENCE

This application is a continuation of International Application No. PCT/US2017/013266, filed on Jan. 12, 2017, entitled "METHODS AND SYSTEMS FOR COMBINED NEGATIVE PRESSURE AND ELECTROADHESION-BASED MANIPULATION IN MANUFACTURING", which claims the benefit of U.S. Provisional Application No. 62/277,756, filed Jan. 12, 2016, entitled "Methods and Systems for Electroadhesion-Based Manipulation in Manufacturing", the entire contents of which are herein incorporated by reference.

BACKGROUND OF THE INVENTION

The mass production of products has led to many innovations over the years. Substantial developments have been made in the industrial handling of various materials and items, particularly in the area of robotics. For example, various types of robotics and other automated systems are now used in order to "pick and place" items during many manufacturing and other materials handling processes. Such robotics and other systems can include robot arms that, for example, grip, lift and/or place an item as part of a designated process. Of course, other manipulations and materials handling techniques can also be accomplished by way of such robotics or other automated systems.

SUMMARY OF THE INVENTION

Despite many advances over the years in this field, there are limitations as to what can be handled in such a robotic or automated manner.

Conventional robotic grippers typically use either suction or a combination of large normal and shear forces and fine control with mechanical actuation in order to grip objects. Such techniques have several drawbacks. For example, the use of suction alone tends to require smooth, clean, dry, non-porous, and generally flat surfaces, which limits the types and conditions of objects that are gripped. Suction alone also tends to require a lot of power for the pumps and can be prone to leaks at any location on a vacuum or low pressure seal, with a resulting loss of suction being potentially catastrophic. The use of mechanical actuation often requires large normal or "crushing" forces against an object, and also tends to limit the ability to robotically grip flexible, deformable, fragile, or delicate objects. Producing large forces also increases the cost of mechanical actuation. Mechanical pumps and conventional mechanical actuation with large crushing forces also often require substantial weight, which is a major disadvantage for some applications, such as the end of a robot arm where added mass must be supported. Furthermore, even when used with sturdy objects, robotic arms, mechanical claws and the like can still leave damaging marks on the surface of the object itself.

Alternative techniques for handling items and materials also have drawbacks. For example, chemical adhesives can leave residues and tend to attract dust and other debris that reduce effectiveness. Chemical adhesives can also require a significant amount of added force to undo or overcome a grip or attachment to an object once such a chemical adhesive grip or attachment is applied, since the gripping interaction and force is typically not reversible in such instances.

Conventional robotic grippers often do not support gripping of more than one object at a time and thus limit the speed with which operations including a plurality of objects are completed. Conventional systems are also often constrained by a requirement that said objects be fed to the robotic gripper with precise orientations by a human operator for proper "pick and place". Furthermore, conventional systems are typically large and require special fencing to protect operators from the hazards of working near high-speed robots.

Although many systems and techniques for handling materials in an automated fashion for the manufacture of an article have generally worked well in the past, there is a desire to provide alternative and improved ways of handling items. In particular, improved automated systems, devices, and techniques are needed to enable the picking and placing or other handling of a plurality of materials including a broad spectrum of flexible and/or porous materials of various shapes and sizes that cannot be handled reliably using conventional vacuum and mechanical methods. Such materials include but are not limited to woven and knit fabric, as used in athletic footwear and apparel manufacturing, carbon fiber sheets, as used in airframe manufacture, and flexible printed circuit boards. The ability to pick up flexible materials without distorting their shape through sagging, wrinkling, or other deformation, and then place them precisely in such a way that preserves their shape is desired so as to enable automation of a variety of subsequent tasks such as welding, fusing, stitching, bonding, printing, or any other task that requires precise placement of flexible materials.

Provided herein are systems, apparatus, and methods of manufacturing an article using electroadhesion technology in concert with vacuum for the acquisition and release of materials.

Provided herein are electroadhesion manufacturing systems. An exemplary electroadhesion system comprises a first platform configured to guide the placement of a first article component and an article components, a second platform having a first predetermined location for the first article component and a second predetermined location for the second article component, an electroadhesive capture element configured to capture the first and second article components placed on the first platform, and a robotic actuator coupled to the capture element to move the capture element to capture the first and second article components and to move the capture element to reposition the captured first and second article components over the first and second predetermined locations on the second platform, respectively. The capture element comprises an electroadhesive surface and one or more negative pressure sources coupled to a plurality of vacuum ports on the electroadhesive surface. The capture element releases the first and second article components onto the first and second predetermined locations, respectively. The first and second article components placed on the second platform are typically assembled into the article. The capture and/or release of the first and second article may be simultaneous or sequential. The electroadhesive surface in some embodiments comprises one or more electroadhesive plates. The electroadhesive surface alternatively or in combination comprises a first zone for capturing the first article component and a second zone for capturing the second article component. In many embodiments, the first and second zones of the electroadhesive surface are optionally separately activated to selectively capture or release one or more of the first and second article components. In some embodiments, one or more of the first and second zones of the electroadhesive surface are configured to detect a presence of one or more of the first and second article components on the first platform, respectively. In many embodiments, the capture element comprises one or more negative pressure sources coupled to the plurality of vacuum ports on the capture element. In some embodiments, the one or more negative pressure sources comprises one or more of a prismatic or cuboid vacuum distributor, a fan, a pump, a turbine, a venturi, and a propeller. In some embodiments, the presence of one or more of the first or second article components on the capture element is detected by sensing pressure changes in a plenum between the capture surface and the housing. In some embodiments, the plurality of vacuum ports comprises a first zone of vacuum ports for capturing the first article component and a second zone of vacuum ports for capturing the second article component. In some embodiments, the first and second zones of vacuum ports are separately controlled to capture or release one or more of the first and second article components. In some embodiments, the vacuum ports in each zone of vacuum ports are connected to a vacuum supply. In some embodiments, the number of vacuum supplies matches the number of zones of vacuum ports such that each zone is connected to a dedicated vacuum supply embedded in each zone, with each vacuum supply being individually controllable so as to control the vacuum of each zone independently of the other zones. For example, in an exemplary embodiment a first vacuum supply is embedded in the first zone and a second vacuum supply is embedded in the second zone such that the first and second vacuum supplies are independent and do not connect. For instance, the vacuum supplies are fans/propellers embedded in each zone hence providing a programmable vacuum source wholly independent of the vacuum provided in other zones. In many embodiments, the vacuum ports traverse the upper and lower surfaces of the contact surface or plate. In some embodiments, the vacuum ports have a uniform cross-section throughout. In some embodiments, the vacuum ports are oriented transverse or perpendicularly to the upper and lower surfaces of the contact surface or plate. In many embodiments, the electroadhesive surface (e.g. electroadhesive plate) comprises holes (also referred to herein as ports) that allow airflow through the electroadhesive surface when the vacuum supply is switched on. In many embodiments, the vacuum holes or ports are oriented adjacent to the electroadhesive surface. In many embodiments, the electroadhesive surface and the vacuum supply are turned on and off independent of one another. In many embodiments, the electroadhesive surface and the vacuum supply are turned on and off collectively with one other. In many embodiments, the capture element comprises a first zone for capturing the first article component and a second zone for capturing the second article component. In many embodiments, the robotic actuator is configured to position the capture element to sequentially capture the first and second article components on the first platform. In many embodiments, sequentially capturing the first and second article components on the first platform comprises the steps of positioning the robotic actuator so that the first article component is aligned with a first predetermined capture location on the first platform, capturing the first article component on the first predetermined capture location, repositioning the robotic actuator or the first platform so that the second article component is aligned with a second predetermined capture location on the first platform, and capturing the second article component on the second predetermined capture location. Alternatively or in combination, the robotic actuator is configured to position the capture element to simultaneously capture the first and second article components on the first platform. For instance, the robotic actuator is configured to move the capture element to sequentially position the captured first and second article components over the first and second predetermined locations on the second platform, respectively. In some embodiments, the second article component is placed directly above the first article component so as to create a stack. In some embodiments, the second platform is moved relative to the capture element such that the captured article components are released at the predetermined locations on the second platform. The robotic actuator is configured to move the capture element to simultaneously position the captured first and second article components over the first and second predetermined locations on the second platform, respectively. In many embodiments the robotic actuator comprises a robotic arm. One or more of the first and second article components comprises a textile piece, a shoe part, an automotive part, a machinery part, or a circuitry part. The article comprises, respectively, at least a portion of an article of clothing, at least a portion of a shoe, at least a portion of a machine, or at least a portion of a circuit. In many embodiments, the electroadhesion manufacturing system further comprises a controller coupled to one or more of the first platform, the second platform, the capture element, and the robotic actuator. In many embodiments, the first platform comprises a first portion configured to guide the placement of an initial set of first and second article components thereon by a user and a second portion configured to guide the placement of a subsequent set of first and second article components thereon by the user. Optionally, after the initial set of first and second article components is placed on the first portion, the first platform is moved to position the first portion closer to the capture element. In many embodiments, the capture element comprises a first zone for capturing the first article component and a second zone for capturing the second article component, the first and second zones being separately mechanically actuated to selectively capture or release one or more of the first and second article components. The capture element optionally comprises a mechanical separation mechanism configured to be advanced from a surface of the capture element to release one or more of the first and second article components.

Provided herein are methods of manufacturing an article. An exemplary method comprises the steps of capturing a first article component placed on a first platform via electroadhesion and application of negative pressure, capturing a second article component placed on the first platform via electroadhesion and application of negative pressure, moving the captured first and second article components to a position over a second platform, releasing the captured first article component to place the first article component on a first predetermined location of the second platform, and releasing the captured second article component to place the second article component on a second predetermined location of the second platform. The first and second article components placed on the second platform are assembled into at least a portion of the article. The step or capturing the one or more of the first and second article components with electroadhesion comprises a step of placing an electroadhesive surface of an electroadhesive capture element over the one or more of the first and second article components and activating the electroadhesive surface. Negative pressure is applied at the electroadhesive surface of the capture element. In many embodiments, the electroadhesive surface comprises a plurality of ports thereon through which the negative pressure is applied. In many embodiments, the electroadhesive surface comprises a first zone for capturing the first article component and a second zone for capturing the second article component. Any one or more of the first and second zones of the electroadhesive surface for example is optionally separately activated to capture or release one or more of the first or second article components. One or more of the step of releasing the captured first article component and releasing the second article component comprises a step of selectively releasing one or more of the first and second article components from the electroadhesion. In some embodiments, the first and second zones are concurrently or sequentially activated. In many embodiments, the capture element is coupled to one or more vacuum sources. In some embodiments, one or more of the capture element and the first platform comprises a first vacuum source for capturing the first article component and a second vacuum source for capturing the second article component. One or more of the first and second vacuum source optionally comprises a prismatic or cuboid vacuum distributor, a fan, a pump, a turbine, a venturi, or a propeller. One or more of the first and second vacuum source is optionally detachable from the capture element. One or more of the steps of capturing the first article component and capturing the second article component comprises a step of detecting a presence of one or more of the first and second article components on the first platform. The step of detecting the presence of one or more of the first and second article components on the first platform for example optionally comprises a step of measuring a change in negative pressure. In some embodiments, one or more of the steps of releasing the captured first article component and releasing the second article component comprises a step of selectively releasing one or more of the first and second article components from the negative pressure. Alternatively or in combination, one or more of the steps of releasing the captured first article component and releasing the second article component comprises a step of applying positive pressure to separate one or more of the first and second article components from the first platform. In some embodiments, one or more of the steps of capturing the first article component and capturing the second article components comprises a step of moving a robotic actuator to capture the one or more of the first and second article components. Moving the captured first and second article components for example optionally comprises moving the robotic actuator from over the first platform to over the second platform or moving the second platform to position it relative to the first and second article components. The robotic actuator is moved to capture the first and second article components before moving over to the second platform. In many embodiments, one or more of the steps of releasing the captured first article component to place the first article component on the first predetermined location of the second platform and releasing the captured second article component to place the second article component on a second predetermined location of the second platform comprises a step of positioning the robotic actuator so that one or more of the first article component and the second article component is precisely placed over the first or second predetermined location, respectively. The method of manufacturing an article optionally further comprises a step of precisely repositioning the robotic actuator so that the second article component is precisely placed over the second predetermined location after the first article component has been released. In many embodiments, the step of capturing the first article component comprises a step of positioning the robotic actuator so that the first article component is aligned with a first predetermined capture location on the first platform and capturing the first article component on the first predetermined capture location. Alternatively or in combination, the step of capturing the second article component comprises a step of repositioning the robotic actuator so that the second article component is aligned with a second predetermined capture location on the first platform and capturing the second article component on the second predetermined capture location. In many embodiments, the robotic actuator comprises a robotic arm. In many embodiments, the method of manufacturing an article optionally further comprises steps of capturing at least a third article component placed on the first platform, moving the captured at least the third article component to the position over the second platform, and releasing the captured at least the third article component on at least a third predetermined location of the second platform. The first, second, and at least the third article components placed on the second platform for example is assembled into the article. In many embodiments, one or more of the first and second article components comprises a textile piece, a shoe part, an automotive part, a machinery part, or a circuitry part, and wherein the article comprises, respectively, at least a portion of an article of clothing, at least a portion of a shoe, at least a portion of a machine, or at least a portion of a circuit.

Provided herein is an electroadhesive apparatus. An exemplary electroadhesive apparatus comprises an electroadhesive plate having a contact surface for capturing one or more target objects with electroadhesion, the electroadhesive plate comprises a plurality of ports thereon and plurality of electroadhesive zones, and a controller configured to individually activate or deactivate electroadhesion in each of the electroadhesive zone. Electroadhesion in each electroadhesive zone is separately activated. The plurality of ports is configured to apply negative pressure to facilitate capture of the one or more target objects. In some embodiments, the electroadhesive zones are coplanar. In some embodiments, the electroadhesive zones are not coplanar but instead are arranged in the approximate form of a curved surface or in a disjoint set of planes. In some embodiments, the electroadhesive surface is coupled to an actuator or a passive linear movement mechanism such that the surfaces are sometimes coplanar and other times on parallel but separate planes. In some embodiments, two or more of the electroadhesive zones are coplanar. In some embodiments, two or more of the electroadhesive zones are non-planar. In some embodiments, one or more of the electroadhesive zones is compressible. In some embodiments, the electroadhesive zones include a generator for generating vacuum or airflow through the electroadhesive surface such that the vacuum or airflow generator creates a negative pressure that leads to additional forces holding an article component against the electroadhesive surface. In some embodiments, the controller is configured to individually activate, modulate the magnitude of, and/or deactivate electroadhesion in each of the electroadhesive zones. In some embodiments, the same or a different controller is configured to individually activate, modulate the magnitude of, and/or deactivate the negative pressure source in each of the electroadhesive zones. In many embodiments, the controller is coupled to each of the electroadhesive zones to individually activate electroadhesion in each of the electroadhesive zones. In some embodiments, activation is accomplished via wireless communication between the controller and the zone control electronics. In many embodiments, the controller is configured to detect capture of the one or more target objects in one or more of the electroadhesive zones. The plurality of ports for example is optionally further configured to apply positive pressure to facilitate release of the captured one or more target objects. In some embodiments, the plurality of ports comprises a plurality of port regions, wherein each port region is configured to be separately actuated and complementary to each separately activated electroadhesive zone to facilitate selective capture or release of the one or more target objects from the electroadhesive zone. In some embodiments, the plurality of ports is coupled to one or more negative pressure sources. In some embodiments, the one or more negative pressure sources comprises one or more of a prismatic or cuboid vacuum distributor, a fan, a pump, a turbine, and a venturi. In some embodiments, the controller is coupled to the one or more negative pressure sources to individually activate the one or more negative pressure sources to apply negative pressure to the plurality of ports. In some embodiments, the one or more negative pressure sources are provided on the gripper. In some embodiments, the pressure source is reversible so as to apply positive pressure to facilitate release. In some embodiments, the applied negative pressure facilitates capture of the one or more target objects by generating a lower dynamic pressure region between the contact surface and the one or more target objects to facilitate lifting of the one or more target objects. In some embodiments, the applied negative pressure facilitates capture of the one or more target objects by generating a static negative pressure within the one or more ports to hold the captured one or more target objects contacting the contacting surface. In some embodiments, changes in pressure in the one or more ports are used to sense the presence or absence of a target object within the zone. In many embodiments, the electroadhesive plate comprises a plurality of electrodes and the plurality of ports is positioned in or between the plurality of electrodes. In some embodiments, the apparatus further comprises a mechanical separation mechanism to facilitate capture or release of the one or more captured target objects.

Provided herein are methods of capturing and releasing a plurality of target objects. An exemplary method comprises the steps of capturing a first target object with a first electroadhesive zone of an electroadhesive plate, capturing a second target object with a second electroadhesive zone of the electroadhesive plate, the first and second electroadhesive zones being in separate positions, applying negative pressure to facilitate capture of one or more of the first and second target objects, releasing the first target object from the first electroadhesive zone while the second target object remains captured by the second electroadhesive zone, and releasing the second target object from the second electroadhesive zone. In many embodiments, the step of capturing one or more of the first and second target objects comprises a step of detecting capture of the one or more of the first and second target objects. Detecting capture optionally comprises sensing pressure changes in a plenum between the capture surface and the housing. In many embodiments, the negative pressure is applied from a plurality of ports in the electroadhesive plate. The plurality of ports for example optionally comprises a first port region and a second port region, the first and second port regions being separately activated to facilitate selective capture of the first and second target objects. In some embodiments, the step of applying the negative pressure to facilitate capture of one or more of the first and second target objects comprises a step of generating a lower dynamic pressure region between a contact surface of the electroadhesive plate and the one or more target objects to facilitate lifting of the one or more target objects. In some embodiments, the step of applying the negative pressure to facilitate capture of one or more of the first and second target objects comprises a step of generating a static negative pressure within the one or more ports to hold the captured one or more target objects contacting a contact surface of the electroadhesive plate. In some embodiments, one or more of releasing the first and second target objects comprises separating a netting from a contact surface of the electroadhesive plate. In some embodiments, the pressure in each zone is measured. Sensed variation in pressure after contact is then used to positively detect at least one of contact and surface adhesion between the target object and the electroadhesive plate. Alternatively or in combination, the method optionally further comprises a step of applying positive pressure to facilitate release of one or more of the first and second target objects. In many embodiments, the positive pressure is applied from a plurality of ports in the electroadhesive plate. The plurality of ports for example optionally comprises a first port region and a second port region, the first and second port regions being separately activated to facilitate selective release of the first and second target objects. In some embodiments, one or more of releasing the first and second target objects comprises separating a netting from a contact surface of the electroadhesive plate.

Provided herein is an electroadhesive apparatus. An exemplary apparatus comprises an electroadhesive plate having a contact surface for capturing one or more target objects with electroadhesion, the electroadhesive plate comprising at least one vacuum port, at least one vacuum source coupled to the at least one vacuum port of the electroadhesive plate, and a controller configured to activate or deactive the electroadhesive plate and the at least one vacuum source to capture or release, respectively, a target object. In some embodiments, the at least one vacuum port comprises a plurality of vacuum ports, wherein the at least one vacuum source comprises a plurality of vacuum sources. In many embodiments, the electroadhesive plate comprises a plurality of electrodes, and wherein the at least one vacuum port located between electrodes or within an electrode. In some embodiments, each vacuum source is coupled to a respective vacuum port. In some embodiments, the at least one vacuum source is fixedly coupled to the electroadhesive plate. In some embodiments, the at least one vacuum source is detachable from the electroadhesive plate. Some embodiments further comprise a robotic arm having an effector end coupled to the electroadhesive plate and at least one vacuum source to adjust a position of the electroadhesive plate and the at least one vacuum source. Some embodiments optionally comprise a mechanical separator operatively coupled to the electroadhesive plate to facilitate release of the target object.

Provided herein are methods of capturing and releasing a plurality of target objects. An exemplary method comprises the steps of applying an electroadhesive force from surface of an electroadhesive plate to a target object, applying a negative pressure from at least one port on the surface to the target object, and releasing the captured target object by terminating application of one or more of the electroadhesive force and negative pressure. The electroadhesive force and the negative pressure are concurrently applied to capture the target object. The at least one vacuum port optionally comprises a plurality of vacuum ports, wherein the at least one vacuum source comprises a plurality of vacuum sources. In some embodiments, each vacuum source is coupled to a respective vacuum port. In many embodiments, the electroadhesive plate comprises a plurality of electrodes, and wherein the at least one vacuum port located between electrodes or within an electrode. In some embodiments, the at least one vacuum source is fixedly coupled to the electroadhesive plate. In some embodiments, the at least one vacuum source is detachable from the electroadhesive plate. Some embodiments further comprise a robotic arm having an effector end coupled to the electroadhesive plate and at least one vacuum source to adjust a position of the electroadhesive plate and the at least one vacuum source. Some embodiments optionally comprise mechanically separating the target object from the electroadhesive plate.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

FIGS. 3A-3H illustrate an embodiment of an electroadhesion manufacturing system in use;

FIG. 3A shows a schematic of the electroadhesion manufacturing system prior with a first and a second article component on a first platform;

FIGS. 3B-3C show schematics of the electroadhesion gripper picking up a first article component but not yet a second article component (i.e., the electroadhesive gripper picks up the article components or parts sequentially, though the electroadhesive gripper can pick up the article components or parts simultaneously as well);

FIGS. 3D-3E show schematics of the electroadhesion gripper picking up the second article component;

FIG. 3F shows a schematic of the system after the electroadhesion gripper has been moved above the second platform;

FIG. 3G shows a schematic of the release of the first article component onto the second platform while the second article component is retained on the electroadhesion gripper;

FIG. 3H shows a schematic of the release of the second article component;

FIG. 4A shows an embodiment of an electroadhesion gripper with a single electroadhesion zone;

FIG. 4B shows a top view of the embodiment of FIG. 4A;

FIG. 4C shows an exemplary embodiment of an electroadhesion gripper with multiple electroadhesion zones for selective capture and release of article components;

FIGS. 6A-6C, 7A-7B, and 8 show schematics of various embodiments of an electroadhesion gripper comprising negative pressure ports to facilitate capture and release of an article component;

FIG. 6A shows an embodiment of an electroadhesion gripper comprising negative pressure ports that facilitate capture of an article component without direct contact between the article component and the electroadhesion gripper;

FIG. 6B shows another embodiment of an electroadhesion gripper comprising negative pressure ports that facilitate capture of an article component utilizing direct contact between the article component and the electroadhesion gripper;

FIG. 6C shows a side-view of an embodiment of an electroadhesion gripper comprising negative pressure ports;

FIGS. 7A-7B illustrates an embodiment of an electroadhesion gripper comprising negative pressure ports with multiple electroadhesion zones, wherein electroadhesion and negative pressure ports in each zone are selectively controlled to facilitate capture and release of one or more article components;

FIG. 8 shows a side view of an embodiment of an electroadhesion gripper comprising negative pressure ports wherein the electroadhesion gripper plate is a removable cartridge;

FIG. 9A shows a cross-section of an embodiment of an electroadhesion gripper comprising negative pressure ports and a mechanical separation mechanism with mechanical separation mechanism retracted;

FIG. 9B shows a cross-section of an embodiment of an electroadhesion gripper comprising negative pressure ports and a mechanical separation mechanism with mechanical separation mechanism extended;

FIGS. 10A-10C show magnified views of the electrodes in exemplary embodiments of an electroadhesion gripper plate with various patterns for electrode and negative pressure port integration;

FIG. 11 shows a flowchart of a method capturing and releasing a plurality of target objects; and FIG. 12 shows a flowchart of a method of manufacturing an article.

DETAILED DESCRIPTION OF THE INVENTION

Figure 1A:
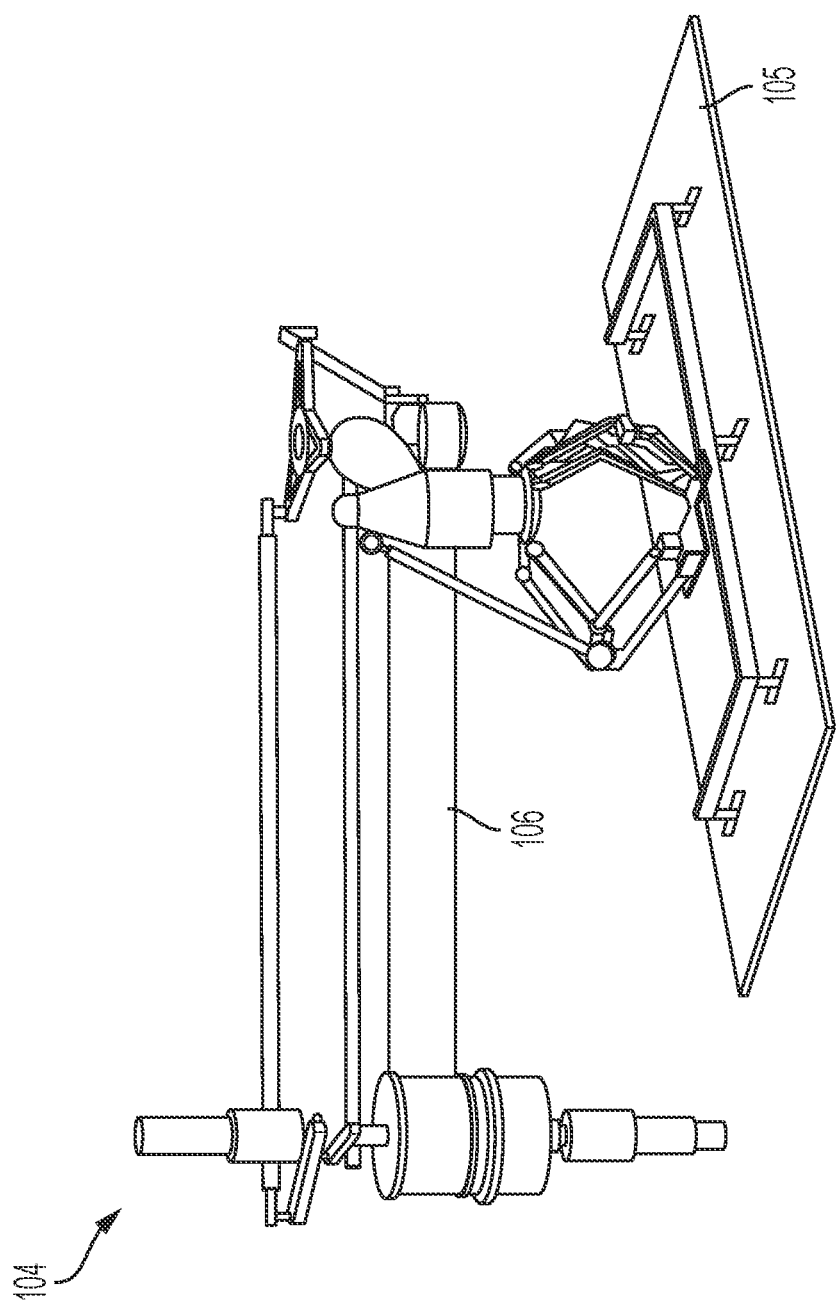
FIG. 1A shows an embodiment of a robotic actuator that embodies a multi-zone electroadhesion gripper.

In the following detailed description, reference is made to the accompanying figures, which form a part hereof. In the figures, similar symbols typically identify similar components, unless context dictates otherwise. The illustrative embodiments described in the detailed description, figures, and claims are not meant to be limiting. Other embodiments may be utilized, and other changes may be made, without departing from the scope of the subject matter presented herein. It will be readily understood that the aspects of the present disclosure, as generally described herein, and illustrated in the figures, can be arranged, substituted, combined, separated, and designed in a wide variety of different configurations, all of which are explicitly contemplated herein.

As the term is used herein, "electroadhesion" refers to the mechanical coupling of two objects using electrostatic forces. Electroadhesion as described herein uses electrical control of these electrostatic forces to permit temporary and detachable attachment between a foreign substrate, for example, an article component and a pick-up surface of an electroadhesion-enabled capture element. This electrostatic adhesion holds the foreign substrate and the pick-up surface together via an electrostatic attraction normal to the surface and increases traction or friction between the foreign substrate and the surface of the capture element due to electrostatic forces created by an applied electric field. The surface of the capture element is placed against or nearby a surface of a foreign substrate. An electrostatic adhesion voltage is then applied to the electrodes using (integrated) control electronics in electrical communication with the electrodes. The electrostatic adhesion voltage comprises unipolar or bipolar operation. In some embodiments, the electrostatic adhesion voltage uses alternating positive or negative charges and ground on neighboring electrodes. In some embodiments, the electrostatic adhesion voltage uses alternating positive and negative charges on neighboring electrodes. In some embodiments, the electrostatic adhesion voltage uses positive and negative charges alternating with ground on neighboring electrodes. As a result of the voltage difference between electrodes, one or more electroadhesive forces are generated, which electroadhesive forces act to hold the surface of the capture element and the foreign substrate against one another. Due to the nature of the forces being applied, it will be readily appreciated that actual contact between the surface of the capture element and the foreign substrate is not necessary. For example, in many embodiments a piece of paper, thin film, netting, or other material or substrate is placed between the pick-up surface of the capture element and the foreign substrate. In many embodiments, there is no other material or substrate between the pick-up surface of the capture element and the foreign substrate. The electrostatic force maintains the current position of the pick-up surface of the capture element relative to the surface of the foreign substrate. The overall electrostatic force is sufficient to overcome the gravitational pull on the foreign substrate, such that the capture element is used to hold the foreign substrate aloft.

The electrostatic adhesion force between the pick-up surface of the capture element and the surface of the foreign substrate diminishes over time (typically 50-100 msec) after the electrode voltage is driven to zero, for example by a high-voltage supply. Thus, the capture element is able to move readily relative to the surface of the foreign substrate. This condition allows the capture element to move before and after an electrostatic adhesion voltage is applied. Well-controlled electrical activation and de-activation enables fast adhesion and detachment. Because the electrode impedance is largely capacitive, the quiescent power supplied to the capture element electrode is small—typically less than 200 mW.

In some embodiments, the capture element comprises a mechanical release/ejection mechanism. In some instances, for example when picking up certain materials, the adhesion force between the pick-up surface of the capture element and the surface of the foreign substrate diminishes more slowly over time. The geometry of the foreign substrate and/or the placement or patterning of the capture element electrodes may cause the foreign substrate to peel away from the electrode surfaces so as to make the placement position unpredictable. In such cases, having a uniform mechanical ejection mechanism to apply deterministic and uniform motion to the foreign substrate helps to ensure deterministic release and high placement accuracy of the foreign substrate. Alternatively or in combination, the mechanical release/ejection mechanism can prevent the surface of the capture element from contacting the surface onto which the foreign substrate is being placed, thereby reducing the chance of disturbance of other materials on the surface which may have been placed there previously.

It is desirable to provide for picking, placing, or other handling of materials such as heavy weight, curled or patterned, nonporous, or otherwise difficult to pick and place materials. In some instances, the use of electroadhesion in combination with vacuum or negative pressure application provides increased forces and improved pick and place functionality to the capture element. The systems, methods, and apparatus for generating vacuum, negative pressure, or positive pressure described herein may be combined with any pick and place capture element known to one of ordinary skill in the art in order to facilitate capture and/or release of materials. Vacuum, negative pressure, or positive pressure may be generated on the capture element using vacuum or pressure generators known to one of ordinary skill in the art, for example using one or more prismatic or cuboid vacuum distributor, fan, air compressor, pump, turbine, or venturi or the like, or any combination thereof.

Figure 1B:
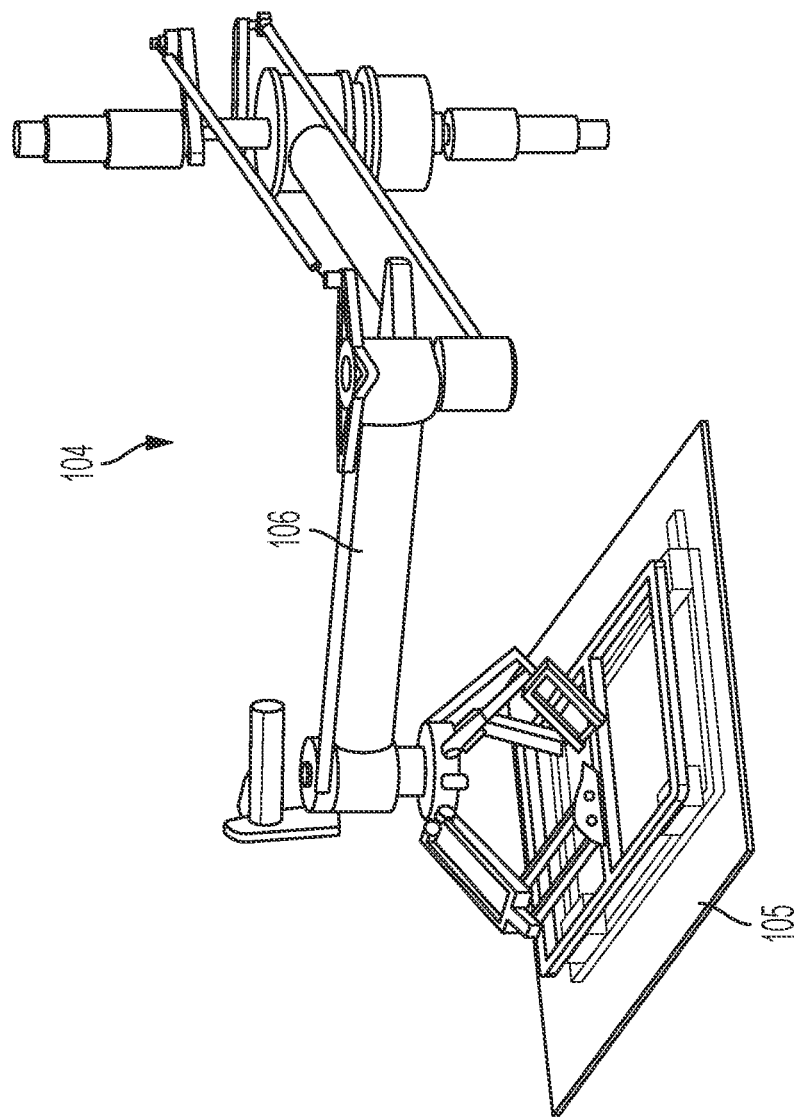
FIG. 1B shows a 180° rotated view of the electroadhesion gripper of FIG. 1A.

FIGS. 1A-1B illustrate 180° rotated views of an embodiment of an electroadhesion gripper 104 comprising a robotic actuator 106 and an electroadhesion capture element 105. The robotic actuator 106 for example optionally comprises a robotic arm operatively coupled to the capture element 105 such that movement of the robotic arm 106 moves the capture element 105. The capture element 105 comprises an electroadhesion surface or plate.

Figure 2:
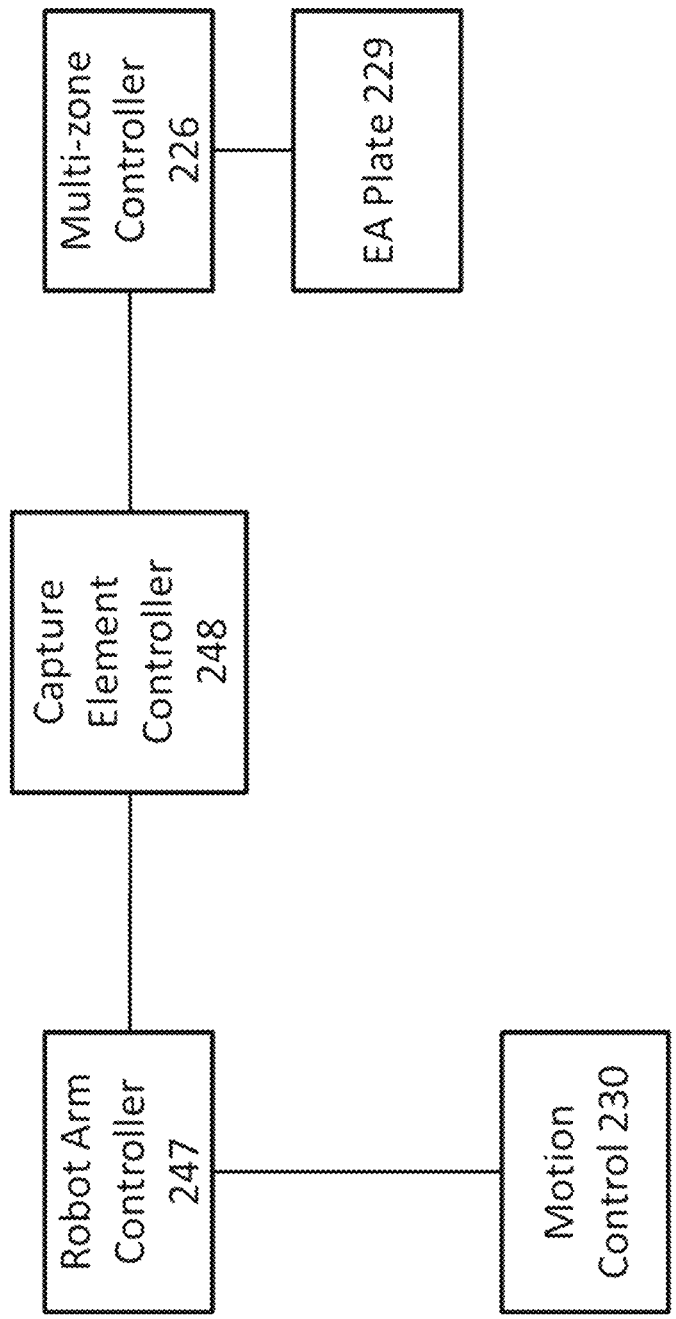
FIG. 2 shows a schematic diagram of an embodiment of an electroadhesion gripper.

FIG. 2 shows a box diagram of an embodiment of an electroadhesion gripper apparatus. The electroadhesion gripper comprises a robotic actuator and a capture element, for example an electroadhesion surface or plate. The electroadhesion plate optionally further comprises one or more individually controllable zones of the electroadhesion. The electroadhesion plate for example comprises a single electroadhesion zone. Alternatively, the electroadhesion plate comprises two electroadhesion zones. It will be understood by one skilled in the art that the electroadhesion plate comprises as many electroadhesion zones as required for the manufacture of an article from a plurality of article components. In some embodiments, the electroadhesion zones are separable from one another such that the electroadhesion plate has replaceable segments or zones.

The electroadhesion gripper comprises a capture element controller 248 in communication with the robotic actuator controller 247 comprising systems for motion control 230 as previously described herein. The capture element controller 248 is optionally in communication with the multi-zone controller system 226. The multi-zone controller system 226 individually controls the actuation of the electroadhesion zones in some embodiments.

FIGS. 3A-3H illustrate an embodiment of an electroadhesion manufacturing system in action. The electroadhesion system comprises a first platform 301, an electroadhesion gripper 304 comprising a robotic actuator 306 coupled to a capture element 305, and a second platform 302. The first platform 301 for example is a turntable. The second platform 302 for example is a conveyor. The robotic actuator 306 for example optionally comprises a robotic arm. The capture element 305 for example optionally comprises an electroadhesion surface or plate. The electroadhesion surface 305 optionally further comprises one or more individually actuating electroadhesion zones, for example a first electroadhesion zone and a second electroadhesion zone. The system is substantially similar to any of the embodiments described herein.

Figure 3E:
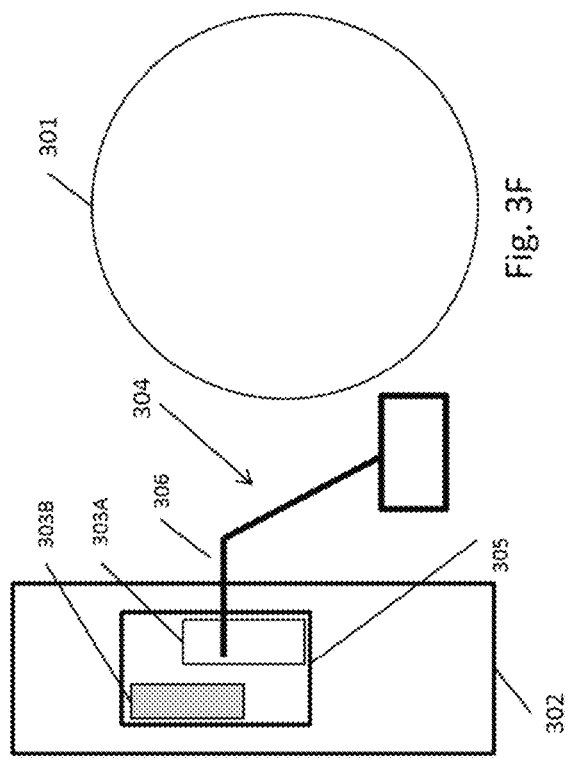
Figure 3F:
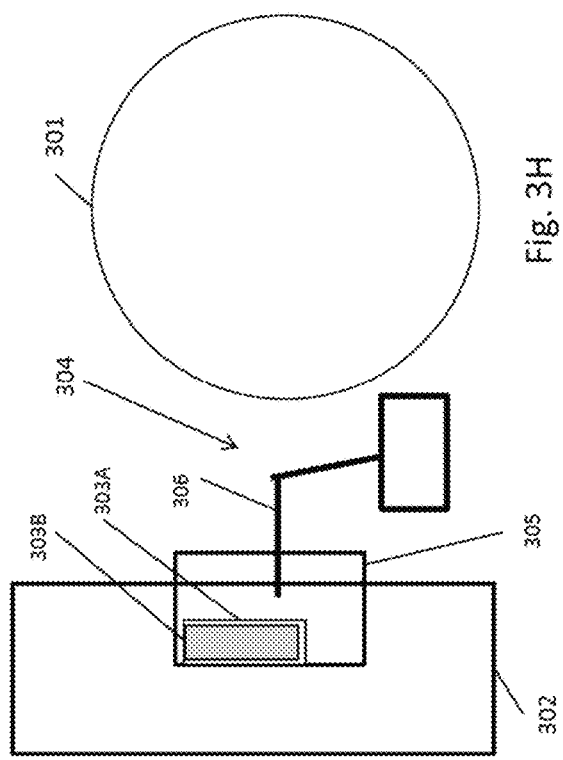
Figure 3G:
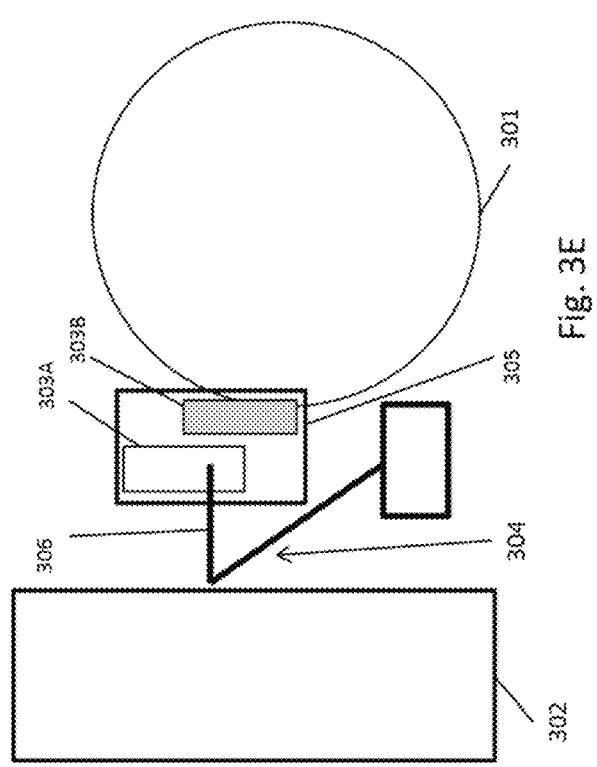
Figure 3H:
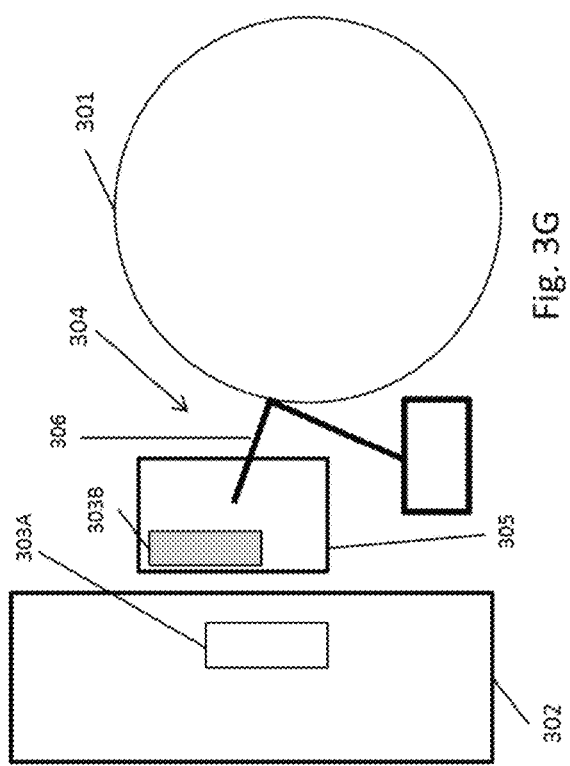

FIG. 3A shows the electroadhesion manufacturing system after a first 303A and a second article component 303B on a first platform 301 have been delivered to the robot-side. FIG. 3B shows the electroadhesion gripper 304 moving to capture the first article component 303A. In some embodiments, the system for example precisely positions the gripper 304 so as to capture the first article component 303A from the first predetermined capture location. Capture of the first article component 303A optionally further comprises activating the first electroadhesion zone but not the second electroadhesion zone. FIG. 3C shows the electroadhesion gripper 304 selectively picking up the first article component 303A but not the second article component 303B. FIG. 3D shows the electroadhesion gripper 304 moving to capture the second article component 303B. The system for example precisely positions the gripper 304 so as to capture the second article component 303B from the second predetermined capture location. Capture of the second article component 303B optionally further comprises activating the second electroadhesion zone while maintaining activation of the first electroadhesion zone so as to have both the first and the second article components 303A, 303B captured by the gripper 304 simultaneously as shown in FIG. 3E. FIG. 3F shows the system after the electroadhesion gripper 304 has moved the first and second article components 303A, 303B to a position above the second platform 302. The system for example optionally positions the robotic actuator 306 so that the first article component 303A is precisely placed over the first predetermined location. The gripper 304 releases the first article component 303A by deactivating the first electroadhesion zone while maintaining activation of the second electroadhesion zone so as to selectively release the first article component 303A but not the second article component 303B. FIG. 3G shows the release of the first article component 303A onto the second platform 302 while the second article component 303B is retained on the electroadhesion gripper 304. FIG. 3H shows the release of the second article component 303B onto the second platform 302. The system for example positions the robotic actuator 306 so that the second article component 303B is precisely placed over the second predetermined location. The gripper 304 optionally releases the second article component 303B by deactivating the second electroadhesion zone to form at least a portion of an assembled article. In many embodiments, the system further detects the presence of one or more of the first or second article components 303A, 303B as described herein.

In many embodiments, the first and second article components 303A, 303B are placed at the first and second predetermined capture locations such that the gripper 304 simultaneously captures the first and the second article components 303A, 303B by simultaneously activating both of the first and the second electroadhesion zones.

In some embodiments, the first and second article components 303A, 303B are roughly placed at the first and second predetermined capture locations, respectively, by the user. A vision system (not shown) coupled to the electroadhesion manufacturing system (e.g., in communication with the gripper 304, robotic actuator 306, controller(s), or other components of the system) is used to determine the actual positions of the first and second article components 303A, 303B. The gripper 304 captures the first and second article components 303A, 303B and the system uses the determined positions and the predetermined release locations (relative to other article components) to inform their placement on the first and second predetermined release locations, respectively. Release is aided by the cessation of negative pressure and/or application of positive pressure as described herein. In some instances, the negative pressure is deactivated prior to, simultaneously with, or after cessation of electroadhesion and/or reversal of the electrode voltage as described herein. In some instances, positive pressure is applied prior to, simultaneously with, or after cessation of electroadhesion and/or reversal of the electrode voltage as described herein. Cessation of negative pressure (and/or application of positive pressure) and electroadhesion activation/deactivation can be done in concert with movement or positioning of the gripper 304 by the robotic actuator 306. This may further be combined with the application of the mechanical ejection/release mechanism described herein.

Figure 4A:
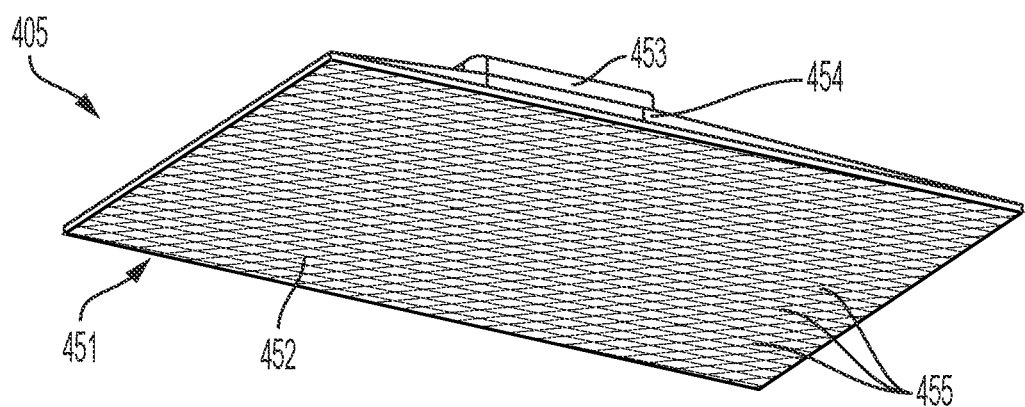
FIGS. 4A-4C illustrate perspective views of various embodiments of an electroadhesion gripper.
Figure 4B:
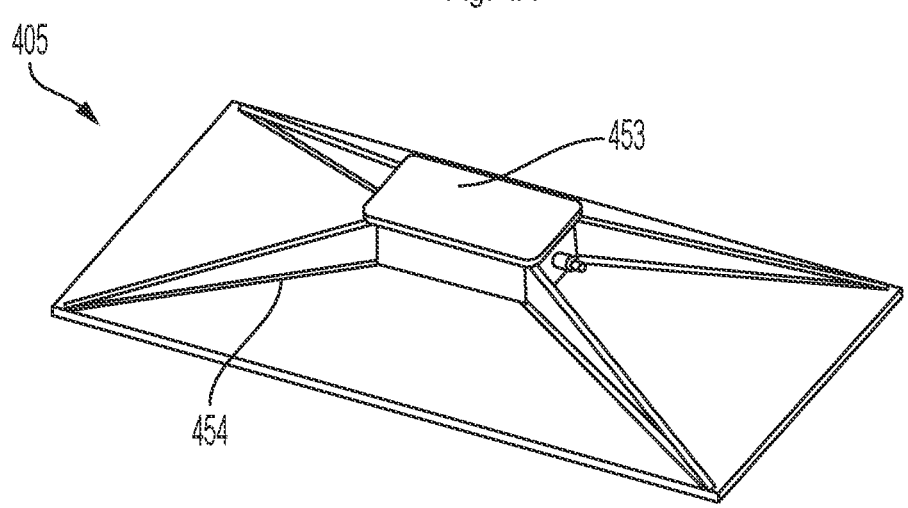
Figure 4C:
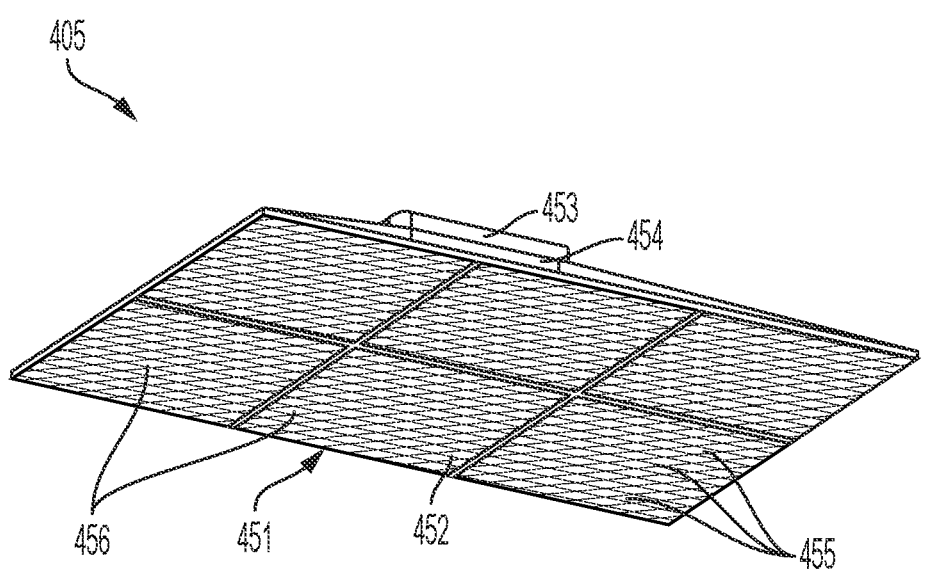

FIGS. 4A-4C illustrate various embodiments of an electroadhesion gripper. The electroadhesion gripper apparatus 405 comprises an electroadhesive plate 451 having a contact surface 452 for capturing one or more target objects (also referred to herein as article components) with electroadhesion, the electroadhesive plate 451 comprising a one or more electroadhesive zones 456, wherein electroadhesion in each electroadhesive zone 456 is separately activated and a controller (as described further herein) configured to individually activate or deactivate electroadhesion in each of the electroadhesive zones 456. FIG. 4A shows an embodiment of an electroadhesion gripper with a single electroadhesion zone 456. The electroadhesion plate 451 comprises a plurality of electrodes 455 and is operatively attached to the robotic actuator. FIG. 4B shows a top view of the embodiment of FIG. 4A highlighting the housing 454 and connection to the robotic actuator 453. FIG. 4C shows an exemplary embodiment of an electroadhesion gripper with multiple electroadhesion zones 456 for selective capture and release of multiple article components. In many embodiments, this multi-zone implementation enables a single-pick of a plurality of article components off of the first platform followed by multiple individuated placements of each article component onto the second platform. The multi-zone implementation thereby reduces the number of motion segments needed to complete the assembled article when compared to accomplishing the assembly with a single-zone gripper. For example, the electroadhesion plate 451 comprises six (6) electroadhesion zones 456 as depicted herein. It will be understood however that the capture element 405 comprises any number of electroadhesion zones 456 depending on the manufacturing requirements of the article assembly.

Figure 5:
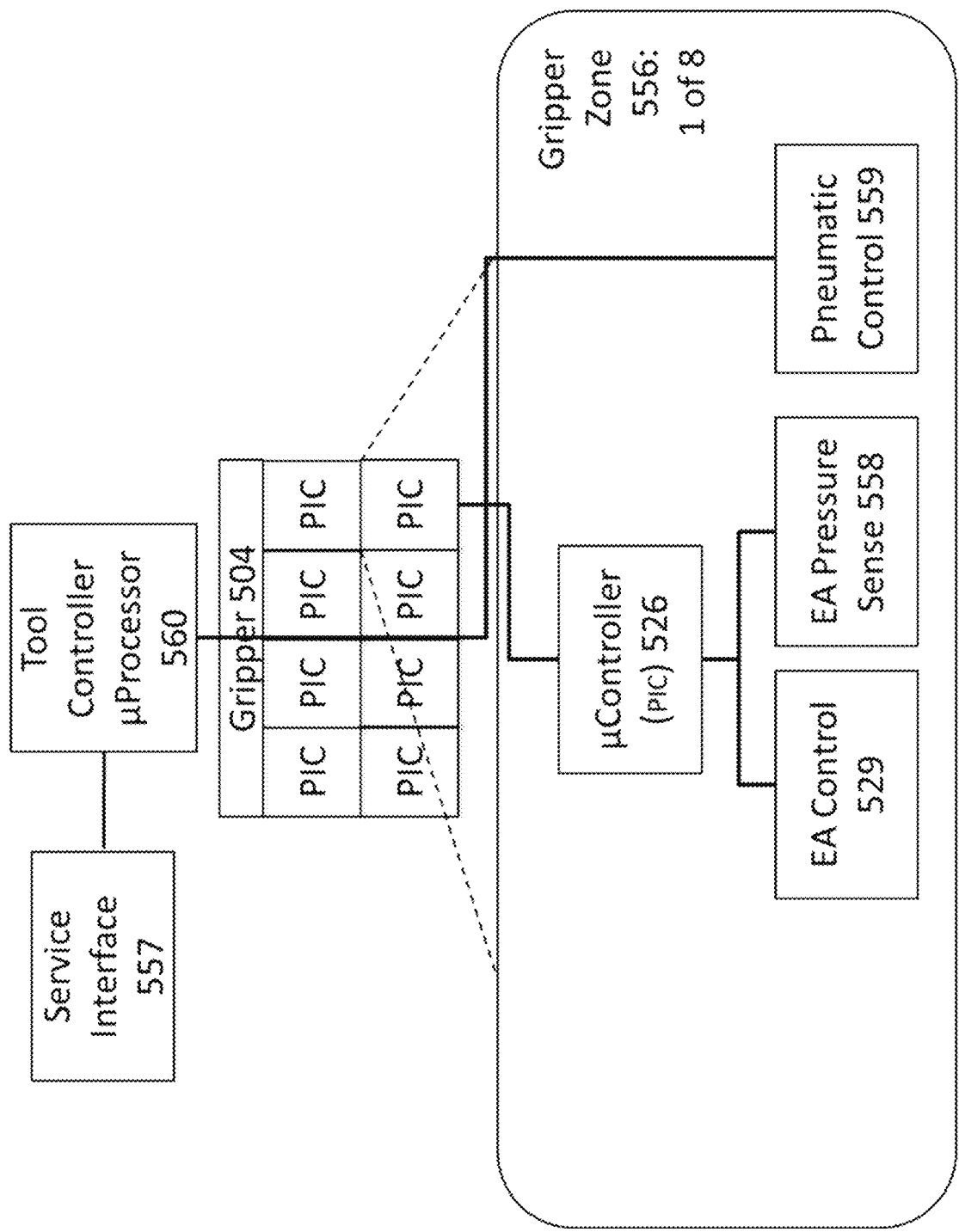
FIG. 5 shows a schematic diagram of an embodiment of an electroadhesion gripper with multiple electroadhesion zones.

FIG. 5 shows a schematic diagram of an embodiment of an electroadhesion gripper 504 with multiple electroadhesion zones 556. A tool controller microprocessor 560 (also referred to herein as a Tool Controller), for example a multi-zone controller, is in communication with a master controller, for example a service interface 557. A service interface 557 on the controller wirelessly receives data from the Tool Controller 560. The pneumatic control 559 for the gripper 504 as a whole is controlled by the Tool Controller 560. The Tool Controller 560 is further in communication with the various components of each electroadhesion zone 556 on the electroadhesion gripper 504. The electroadhesion gripper 504 for example comprises a 2×4 rectangular array of eight (8) electroadhesion zones 556. Each electroadhesion zone 556 is further controlled by a dedicated microcontroller 526 in communication with one or more of the electroadhesion actuation control 529 and pressure sensor 558 for electroadhesion article component presence sensing. Detecting the presence of an article component for example optionally comprises measuring at the one or more of the electroadhesive zones 556 a change in pressure. Such detection occurs when pneumatic controls 559 are embedded in the gripper 504 by embedding an air pressure sensor 558 in the electroadhesion zone 556 to measure changes in pressure in the zone 556 when the article component comes into contact with the capture element surface. The communication between the microcontroller 526 and the tool controller 560 for example is wireless.

The Tool Controller 560 is optionally further in communication with a pneumatic control system 559 for application of negative or positive pressure during capture or release of an article component.

The Tool Controller 560 is configured to communicate with the master system controller 215 in order to detect capture of one or more target objects in one or more electroadhesive zones 556 by air pressure sensor 558. The electroadhesive zone 556 for example optionally comprises a consumable cartridge that snaps into the multi-zone tool controller receptacle. A microcontroller 526, for example, a PIC microcontroller from Microchip, in each zone 556 controls the electrode voltage.

FIGS. 6A-6C, 7A-7B, and 8 show various embodiments of an electroadhesion gripper 604, 804 comprising negative pressure ports 667, 767 to facilitate capture and release of an article component 603, 703. The electroadhesion gripper capture element 605, 705 comprises an electroadhesive plate 651, 751, 851 with a plurality of ports 667, 767 thereon, the plurality of ports 667, 767 configured to apply negative pressure 668 to facilitate capture of the one or more target objects 603, 703, for example one or more article components. The plurality of ports 667, 767 is further configured to apply positive pressure to facilitate release of the captured one or more target objects 603, 703. The plurality of ports 667, 767 is coupled to one or more negative pressure sources, for example, a prismatic or cuboid vacuum distributor, a fan, a pump, a turbine, a venturi, or any combination thereof. In some embodiments, the one or more negative pressure sources is generated on the gripper 604, 804. The one or more negative pressure sources may be activated and/or deactivated independently from or simultaneously with one another. Application of negative pressure may increase the resistance of the one or more target objects 603, 703 to "peeling" off of the electroadhesive plate 651, 751, 851.

The plurality of ports 667, 767 is configured to allow airflow through the electroadhesive plate 651, 751, 851 when the vacuum supply is activated (e.g., switched on). In many instances, the plurality of ports 667, 767 are oriented adjacent the contact surface of the electroadhesive plate 651, 751, 851.

The plurality of negative pressure ports 667, 767 for example comprises more than four negative pressure ports 667, 767. In some embodiments, the plurality of ports comprises five or more ports. In some embodiments, the plurality of ports comprises at least seven ports. In some embodiments, the plurality of ports comprises at least ten ports. In some embodiments, the plurality of ports comprises at least twenty ports. In some embodiments, the plurality of ports comprises at least thirty ports. In some embodiments, the plurality of ports comprises at least forty ports. In some embodiments, the plurality of ports comprises at least fifty ports. In some embodiments, the plurality of ports comprises at least sixty ports. In some embodiments, the plurality of ports comprises at least seventy ports. In some embodiments, the plurality of ports comprises at least eighty ports. In some embodiments, the plurality of ports comprises at least ninety ports. In some embodiments, the plurality of ports comprises at least one hundred ports. In some embodiments, the plurality of ports comprises at least two hundred ports. In some embodiments, the plurality of ports comprises at least three hundred ports. In some embodiments, the plurality of ports comprises at least four hundred ports. In some embodiments, the plurality of ports comprises at least five hundred ports. In some embodiments, the plurality of ports comprises at least six hundred ports. In some embodiments, the plurality of ports comprises at least seven hundred ports. In some embodiments, the plurality of ports comprises at least eight hundred ports. In some embodiments, the plurality of ports comprises at least nine hundred ports. In some embodiments, the plurality of ports comprises at least one thousand ports. In some embodiments, the plurality of ports comprises at least two thousand ports. In some embodiments, the plurality of ports comprises around five to around one hundred ports. In some embodiments, the plurality of ports comprises around five to around ten ports. In some embodiments, the plurality of ports comprises around five to around twenty ports. In some embodiments, the plurality of ports comprises a range of around ten to around twenty ports. In some embodiments, the plurality of ports comprises a range of about five to about thirty ports. In some embodiments, the plurality of ports comprises a range of around ten to thirty ports. In some embodiments, the plurality of ports comprises a range of around twenty to thirty ports. In some embodiments, the plurality of ports comprises a range of about five to about forty ports. In some embodiments, the plurality of ports comprises a range of around ten to forty ports. In some embodiments, the plurality of ports comprises a range of around twenty to forty ports. In some embodiments, the plurality of ports comprises around thirty to around forty ports. In some embodiments, the plurality of ports comprises a range of about five to about fifty ports. In some embodiments, the plurality of ports comprises a range of around ten to fifty ports. In some embodiments, the plurality of ports comprises a range of around twenty to fifty ports. In some embodiments, the plurality of ports comprises around thirty to around fifty ports. In some embodiments, the plurality of ports comprises around forty to around fifty ports. In some embodiments, the plurality of ports comprises a range of about five to about sixty ports. In some embodiments, the plurality of ports comprises a range of around ten to sixty ports. In some embodiments, the plurality of ports comprises a range of around twenty to sixty ports. In some embodiments, the plurality of ports comprises around thirty to around sixty ports. In some embodiments, the plurality of ports comprises around forty to around sixty ports. In some embodiments, the plurality of ports comprises around fifty to around sixty ports. In some embodiments, the plurality of ports comprises a range of about five to about sixty ports. In some embodiments, the plurality of ports comprises a range of around ten to sixty ports. In some embodiments, the plurality of ports comprises a range of around twenty to sixty ports. In some embodiments, the plurality of ports comprises around thirty to around sixty ports. In some embodiments, the plurality of ports comprises around forty to around sixty ports. In some embodiments, the plurality of ports comprises around fifty to around sixty ports. In some embodiments, the plurality of ports comprises a range of about five to about seventy ports. In some embodiments, the plurality of ports comprises a range of around ten to seventy ports. In some embodiments, the plurality of ports comprises a range of around twenty to seventy ports. In some embodiments, the plurality of ports comprises around thirty to around seventy ports. In some embodiments, the plurality of ports comprises around forty to around seventy ports. In some embodiments, the plurality of ports comprises around fifty to around seventy ports. In some embodiments, the plurality of ports comprises around sixty to around seventy ports. In some embodiments, the plurality of ports comprises a range of about five to about eighty ports. In some embodiments, the plurality of ports comprises a range of around ten to eighty ports. In some embodiments, the plurality of ports comprises a range of around twenty to eighty ports. In some embodiments, the plurality of ports comprises around thirty to around eighty ports. In some embodiments, the plurality of ports comprises around forty to around eighty ports. In some embodiments, the plurality of ports comprises around fifty to around eighty ports. In some embodiments, the plurality of ports comprises around sixty to around eighty ports. In some embodiments, the plurality of ports comprises around seventy to around eighty ports. In some embodiments, the plurality of ports comprises a range of about five to about ninety ports. In some embodiments, the plurality of ports comprises a range of around ten to ninety ports. In some embodiments, the plurality of ports comprises a range of around twenty to ninety ports. In some embodiments, the plurality of ports comprises around thirty to around ninety ports. In some embodiments, the plurality of ports comprises around forty to around ninety ports. In some embodiments, the plurality of ports comprises around fifty to around ninety ports. In some embodiments, the plurality of ports comprises around sixty to around ninety ports. In some embodiments, the plurality of ports comprises around seventy to around ninety ports. In some embodiments, the plurality of ports comprises around eighty to around ninety ports. In some embodiments, the plurality of ports comprises a range of about five to about one hundred ports. In some embodiments, the plurality of ports comprises a range of around ten to one hundred ports. In some embodiments, the plurality of ports comprises a range of around twenty to one hundred ports. In some embodiments, the plurality of ports comprises around thirty to around one hundred ports. In some embodiments, the plurality of ports comprises around forty to around one hundred ports. In some embodiments, the plurality of ports comprises around fifty to around one hundred ports. In some embodiments, the plurality of ports comprises around sixty to around one hundred ports. In some embodiments, the plurality of ports comprises around seventy to around one hundred ports. In some embodiments, the plurality of ports comprises around eighty to around one hundred ports. In some embodiments, the plurality of ports comprises around ninety to around one hundred ports. In some embodiments, the plurality of ports comprises around five to around one thousand ports. In some embodiments, the plurality of ports comprises around five to around two hundred ports. In some embodiments, the plurality of ports comprises around five to around three hundred ports. In some embodiments, the plurality of ports comprises a range of around ten to around four hundred ports. In some embodiments, the plurality of ports comprises a range of about five to about five hundred ports. In some embodiments, the plurality of ports comprises a range of about five to about six hundred ports. In some embodiments, the plurality of ports comprises a range of about five to about seven hundred ports. In some embodiments, the plurality of ports comprises a range of about five to about eight hundred ports. In some embodiments, the plurality of ports comprises a range of about five to about nine hundred ports. In some embodiments, the plurality of ports comprises a range of about five to about one thousand ports. In some embodiments, the plurality of ports comprises a range of about five to about two thousand ports. In some embodiments, the plurality of ports comprises a range of around one hundred to two hundred ports. In some embodiments, the plurality of ports comprises a range of around one hundred to three hundred ports. In some embodiments, the plurality of ports comprises a range of around one hundred to four hundred ports. In some embodiments, the plurality of ports comprises a range of around one hundred to five hundred ports. In some embodiments, the plurality of ports comprises a range of around one hundred to six hundred ports. In some embodiments, the plurality of ports comprises a range of around one hundred to seven hundred ports. In some embodiments, the plurality of ports comprises a range of around one hundred to eight hundred ports. In some embodiments, the plurality of ports comprises a range of around one hundred to nine hundred ports. In some embodiments, the plurality of ports comprises a range of around one hundred to one thousand ports. In some embodiments, the plurality of ports comprises a range of around one hundred to two thousand ports. In some embodiments, the plurality of ports comprises a range of around two hundred to three hundred ports. In some embodiments, the plurality of ports comprises a range of around two hundred to four hundred ports. In some embodiments, the plurality of ports comprises a range of around two hundred to five hundred ports. In some embodiments, the plurality of ports comprises a range of around two hundred to six hundred ports. In some embodiments, the plurality of ports comprises a range of around two hundred to seven hundred ports. In some embodiments, the plurality of ports comprises a range of around two hundred to eight hundred ports. In some embodiments, the plurality of ports comprises a range of around two hundred to nine hundred ports. In some embodiments, the plurality of ports comprises a range of around two hundred to one thousand ports. In some embodiments, the plurality of ports comprises a range of around two hundred to two thousand ports. In some embodiments, the plurality of ports comprises a range of around three hundred to four hundred ports. In some embodiments, the plurality of ports comprises a range of around three hundred to five hundred ports. In some embodiments, the plurality of ports comprises a range of around three hundred to six hundred ports. In some embodiments, the plurality of ports comprises a range of around three hundred to seven hundred ports. In some embodiments, the plurality of ports comprises a range of around three hundred to eight hundred ports. In some embodiments, the plurality of ports comprises a range of around three hundred to nine hundred ports. In some embodiments, the plurality of ports comprises a range of around three hundred to one thousand ports. In some embodiments, the plurality of ports comprises a range of around three hundred to two thousand ports. In some embodiments, the plurality of ports comprises a range of around four hundred to five hundred ports. In some embodiments, the plurality of ports comprises a range of around four hundred to six hundred ports. In some embodiments, the plurality of ports comprises a range of around four hundred to seven hundred ports. In some embodiments, the plurality of ports comprises a range of around four hundred to eight hundred ports. In some embodiments, the plurality of ports comprises a range of around four hundred to nine hundred ports. In some embodiments, the plurality of ports comprises a range of around four hundred to one thousand ports. In some embodiments, the plurality of ports comprises a range of around four hundred to two thousand ports. In some embodiments, the plurality of ports comprises a range of around five hundred to six hundred ports. In some embodiments, the plurality of ports comprises a range of around five hundred to seven hundred ports. In some embodiments, the plurality of ports comprises a range of around five hundred to eight hundred ports. In some embodiments, the plurality of ports comprises a range of around five hundred to nine hundred ports. In some embodiments, the plurality of ports comprises a range of around five hundred to one thousand ports. In some embodiments, the plurality of ports comprises a range of around five hundred to two thousand ports. In some embodiments, the plurality of ports comprises a range of around six hundred to seven hundred ports. In some embodiments, the plurality of ports comprises a range of around six hundred to eight hundred ports. In some embodiments, the plurality of ports comprises a range of around six hundred to nine hundred ports. In some embodiments, the plurality of ports comprises a range of around six hundred to one thousand ports. In some embodiments, the plurality of ports comprises a range of around six hundred to two thousand ports. In some embodiments, the plurality of ports comprises a range of around seven hundred to eight hundred ports. In some embodiments, the plurality of ports comprises a range of around seven hundred to nine hundred ports. In some embodiments, the plurality of ports comprises a range of around seven hundred to one thousand ports. In some embodiments, the plurality of ports comprises a range of around seven hundred to two thousand ports. In some embodiments, the plurality of ports comprises a range of around eight hundred to nine hundred ports. In some embodiments, the plurality of ports comprises a range of around eight hundred to one thousand ports. In some embodiments, the plurality of ports comprises a range of around eight hundred to two thousand ports. In some embodiments, the plurality of ports comprises a range of around nine hundred to one thousand ports. In some embodiments, the plurality of ports comprises a range of around nine hundred to two thousand ports. In some embodiments, the plurality of ports comprises a range of around one thousand to around two thousand ports. In some embodiments, the plurality of ports comprises a range of around one thousand one hundred to around two thousand ports. In some embodiments, the plurality of ports comprises a range of around one thousand two hundred to around two thousand ports. In some embodiments, the plurality of ports comprises a range of around one thousand three hundred to around two thousand ports. In some embodiments, the plurality of ports comprises a range of around one thousand four hundred to around two thousand ports. In some embodiments, the plurality of ports comprises a range of around one thousand five hundred to around two thousand ports. In some embodiments, the plurality of ports comprises a range of around one thousand six hundred to around two thousand ports. In some embodiments, the plurality of ports comprises a range of around one thousand seven hundred to around two thousand ports. In some embodiments, the plurality of ports comprises a range of around one thousand eight hundred to around two thousand ports. In some embodiments, the plurality of ports comprises a range of around one thousand nine hundred to around two thousand ports. It will be understood that the plurality of ports may comprise any number of ports in order generate negative pressure at the surface of the capture element.

Figure 9A:
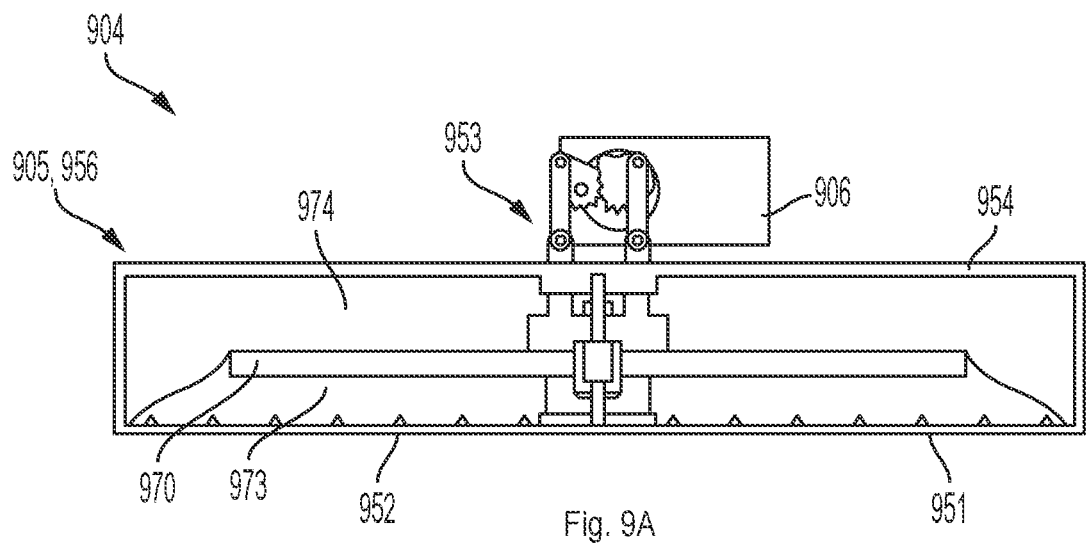
FIGS. 9A-9B show schematics of an embodiment of an electroadhesion gripper comprising negative pressure ports and a mechanical separation mechanism to facilitate capture and release of an article component.

FIG. 6A shows an embodiment of an electroadhesion gripper 604 comprising negative pressure ports 667 that facilitate capture of an article component 603 without direct contact between the article component 603 and the electroadhesion gripper 604. The electroadhesion gripper 604 comprises a capture element 605, for example an electroadhesive plate 651, with a plurality of ports 667 thereon, and a housing 654. The housing 654 for example extends from the electroadhesive plate 651 to the connection 671 to one or more of the robotic actuator and negative pressure source and forms a plenum 674 therebetween (as shown in FIG. 9A). The housing 654 for example is optionally cuboid shaped, with contact between the electroadhesive plate 651 and the housing 654 forming one or more of a right angle and an obtuse angle. The housing 654 for example is curved and/or forms a right angle where the housing 654 contacts the connection 671 to the negative pressure source. The housing 654 is for example optionally prismatic. The applied negative pressure 668 for example facilitates capture of the one or more target objects 603 by generating a lower dynamic pressure region 669 between the contact surface 652 and the one or more target objects 603 to facilitate lifting of the one or more target objects 603.

FIG. 6B shows another embodiment of an electroadhesion gripper 604 comprising negative pressure ports 667 that facilitate capture of an article component 603 utilizing direct contact between the article component 603 and the electroadhesion gripper 604. The applied negative pressure 668 for example facilitates capture of the one or more target objects 668 by generating a static negative pressure within the one or more ports 667 to hold the captured one or more target objects 603 contacting the contact surface 652.

FIG. 6C shows a side-view of an embodiment of an electroadhesion gripper 604 comprising negative pressure ports 667. The electroadhesion gripper 604 comprises an electroadhesive plate 651 with a plurality of ports 667 thereon, any one or more of the plurality of ports 667 configured to apply negative pressure 668 to facilitate capture of the one or more target objects 603, for example one or more article components. Any one or more of the plurality of ports 667 is further configured to apply positive pressure to facilitate release of the captured one or more target objects 603. Any one or more of the plurality of ports 667 is coupled to one or more negative pressure sources 676, for example a prismatic or cuboid vacuum distributor, a fan, a pump, a turbine, a venturi, or any combination thereof. The one or more target objects 603 and applied negative pressure 668 have not been shown for clarity.

FIGS. 7A-7B illustrates an embodiment of an electroadhesion gripper capture element 705 comprising negative pressure or vacuum ports 767 with multiple electroadhesion zones 756, wherein electroadhesion and the negative pressure ports 767 in each zone 756 are selectively controllable to facilitate capture and release of one or more article components 703. The plurality of ports 767 comprises a plurality of port regions 775, wherein each port region 775 is configured to be separately actuated and complementary to each individuated electroadhesive zone 756 to facilitate selective capture or release of the one or more target objects 703 from the electroadhesive zone 756. In some embodiments, the plurality of vacuum ports 767 comprises a first zone of vacuum ports 775A for capturing a first article component 703A and a second zone of vacuum ports 775B for capturing a second article component 703B. In many embodiments, each electroadhesion zone 756 comprises a zone of vacuum ports 775. In some embodiments, the first and second zones of vacuum ports 775A, 775B are separately controlled to capture or release one or more of the first and second article components 703A, 703B. In some embodiments, the vacuum ports 767 in each zone of vacuum ports 775 are connected to a vacuum supply. In some embodiments, the number of vacuum supplies matches the number of zones of vacuum ports 775 such that each zone 775 is connected to a dedicated vacuum supply embedded in each zone 775, with each vacuum supply being individually controllable so as to control the vacuum 768 of each zone independently of the other zones 775. For example, in an exemplary embodiment a first vacuum supply is embedded in the first zone 775A and a second vacuum supply is embedded in the second zone 775B such that the first and second vacuum supplies are independent and do not connect. For instance, the vacuum supplies are fans/propellers embedded in each zone 775 hence providing a programmable vacuum source wholly independent of the vacuum provided in other zones 775. In many embodiments, the vacuum ports 767 span across the upper and lower surfaces of the contact surface or plate 751. In some embodiments, the vacuum ports 767 have a uniform diameter throughout. In some embodiments, the vacuum ports 767 are oriented transverse or perpendicularly to the upper and lower surfaces of the contact surface or plate 751. In some embodiments, the vacuum ports 767 are distributed throughout the electroadhesive surface 751 such that the ports 767 are between and/or on top of the electrodes of the electroadhesive surface 751.

In many embodiments, the vacuum sources for each zone of vacuum ports 775 are interchangeable between zones 775. In some embodiments, each electroadhesion zone 756 comprising a zone of vacuum ports 775 is separable from each other zone 756 such that the electroadhesion plate 751 has replaceable segments or zones 756. In some embodiments, each replaceable segment 756 of the electroadhesion plate 751 comprises an electroadhesion zone 756 with a zone of vacuum ports 775 and a housing 754 with connection to the gripper 704 (for example as illustrated in FIG. 6A), such that the housing 754 and electroadhesion zone 756 are a detachable unit.

In many embodiments, the contact surface 752 of the electroadhesion plate 751 is non-planar. In many embodiments, the contact surface 752 of the electroadhesion plate 751 is compressible, for example being made of a compressible material. In some embodiments the contact surface 752 of the electroadhesion plate 751 is a compressible planar surface. In some embodiments, the contact surface 752 of the electroadhesion plate 751 is a compressible non-planar surface. In some embodiments, the contact surface 752 of the electroadhesion plate 751 is a non-compressible non-planar surface.

In many embodiments, the contact surface 751 of one or more of an electroadhesion zone 756 is non-planar. In many embodiments, the contact surface 751 of the electroadhesion zone 756 is compressible, for example being made of a compressible material, having a compressible coating, and/or being mounted via a compressible interface. In some embodiments the contact surface 752 of the electroadhesion zone 756 is a compressible planar surface. In some embodiments, the contact surface 752 of the electroadhesion zone 756 is a compressible non-planar surface. In some embodiments, the contact surface 752 of the electroadhesion zone 756 is a non-compressible non-planar surface. In some embodiments the plurality of electroadhesion zones 756 in the gripper are arranged so as to be coplanar. In some embodiments the plurality of electroadhesion zones 756 in the gripper are arranged so as to be not coplanar—for example, specifically arranged so as to improve gripping force and article flatness following release onto the second platform.

This hybrid approach enables the gripper to leverage electroadhesion on non-porous and/or porous article components, for example a fabric mesh, that exhibit good electron mobility, for example, conductors or weakly-conductive insulators. This approach further optionally leverages vacuum to acquire article components that do not have sufficient electron mobility or do not create enough normal force to flatten deformed article components. In some embodiments, the combination of electroadhesion, vacuum, and/or mechanized release allows the hybrid gripper to deliver deterministic acquisition and release times across a broad range of article materials.

In some embodiments, the vacuum and electroadhesion act in such a way as to aid each other. The vacuum brings the target object/article component closer to the electroadhesive surface, which in turn enhances the electroadhesive force. Electroadhesion allows for better sealing of the target object against the electroadhesive surface, thereby enhancing the vacuum forces on the target object.

FIG. 8 shows a side view of an embodiment of an electroadhesion gripper comprising negative pressure ports 867 wherein the electroadhesion gripper plate 851 is a removable cartridge.

Figure 9B:
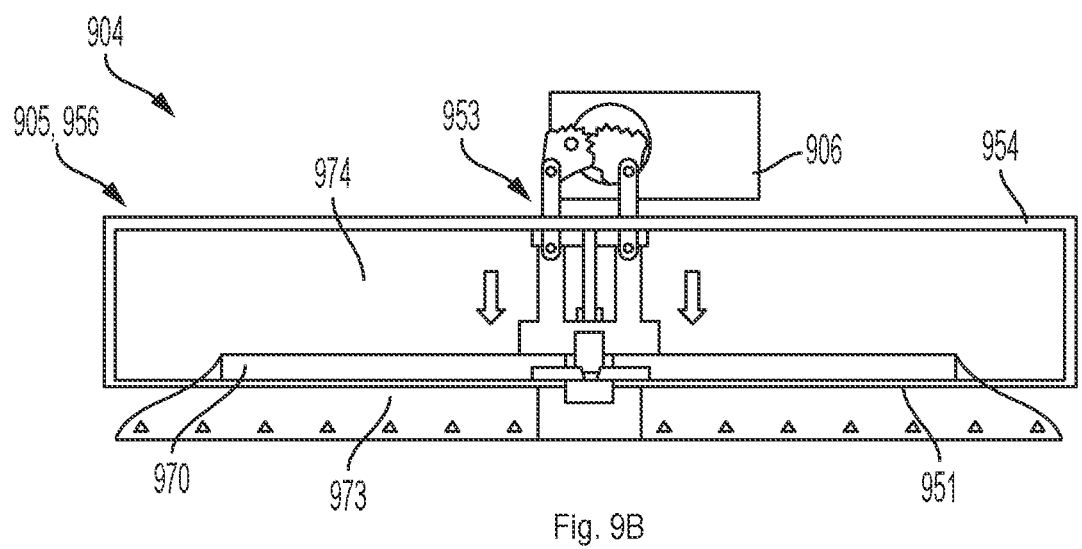

FIGS. 9A-9B show schematics of an embodiment of an electroadhesion gripper 904 comprising an electroadhesion plate 951 with negative pressure ports 967, and optional mechanical separation mechanism 970, to facilitate capture and release of an article component. The electroadhesion plate 951 with negative pressure ports 967 may be substantially similar to other embodiments described herein. The mechanical separation mechanism comprises a netting 965 configured to be placed over the contact surface of the electroadhesion plate 951. The netting 965 for example is configured to separate from the contact surface to facilitate release of one or more article components. The gripper 904 optionally further comprises a linear actuator 906 coupled to the electroadhesive plate 951 and the netting 965 to separate the netting 965 and the contact surface from one another. In some embodiments, the ejection filaments 965 rest on the contact surface of the electroadhesion plate 951 when retracted. In some embodiments, the contact surface of the electroadhesion plate 951 comprises surface indentations that allow the ejection filaments 965 to be housed (e.g., inlaid) within the indentation such that the contact surface of the electroadhesion plate 951 comprises a flat surface without any offsetting due to the ejection filaments 965.

FIG. 9A shows a cross-section of schematic of an embodiment of an electroadhesion gripper 904 comprising an electroadhesion plate 951 with negative pressure ports 967 and optional mechanical separation mechanism 970, with mechanical separation mechanism 970 retracted. The gripper 904 comprises a plenum 974 formed between the electroadhesion plate 951 and the housing 954 of the capture element 905. When retracted as shown here, the ejector 970 is housed in the plenum 974. The capture element 905 is connected to the robotic actuator 906 via a linkage system 953.

FIG. 9B shows a cross-section of an embodiment of an electroadhesion gripper 904 comprising negative pressure ports 967 and optional mechanical separation mechanism 970 with mechanical separation mechanism 970 extended. Extension of the ejector blades 973 through the electroadhesion plate 951 mechanically separates the capture element 905 from a captured article component, thereby facilitating the release of said article component from the capture element 905.

Figure 9C:
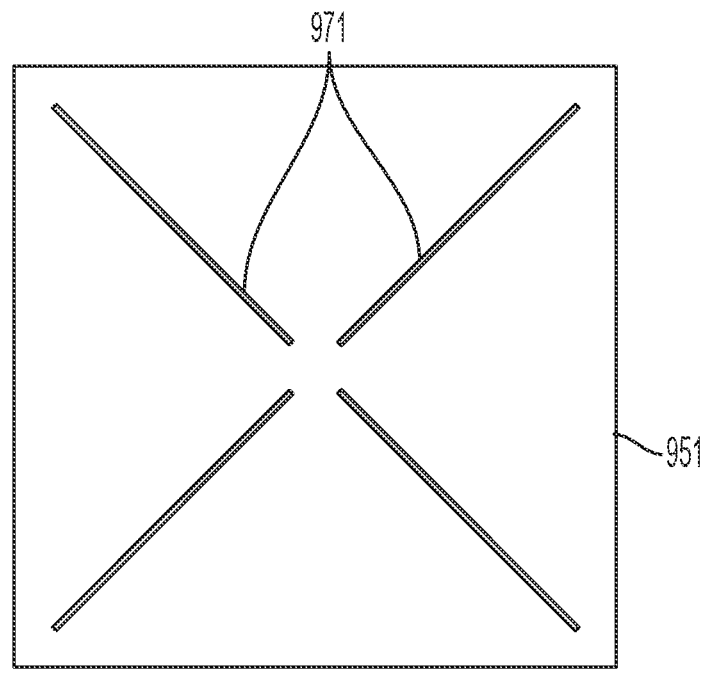
FIG. 9C shows a top view of an embodiment of an electroadhesion plate.

FIG. 9C shows a top view of the electroadhesion plate 951. In some embodiments, the electroadhesion plate 951 comprises slots 971 through which the ejector blades 973 are extended to contact the article component and facilitate release of said article component from the capture element 905.

Figure 9D:
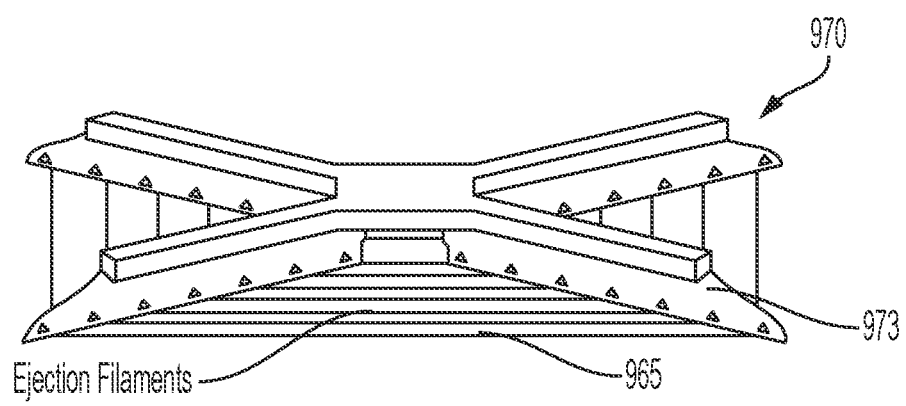
FIG. 9D shows a perspective view of an embodiment of a mechanical separation mechanism.

FIG. 9D shows a perspective view of an embodiment of a mechanical separation mechanism 970 as used in FIG. 9A-9D. The mechanical separation mechanism 970 comprises a plurality of ejector blades 973, for example four ejector blades 973, which are arranged so as to precisely correspond with the slots 971 on the electroadhesion plate 951. The ejector blades 973 for example form a cross. In some embodiments, the ejector blades 973 are coupled for a netting or filaments 965 which are in contact with the captured article component. Actuation of the ejector blades 973 through the electroadhesion plate 951 facilitates release of the article component from the contact surface 952 of the electroadhesion plate 951.

In many embodiments, the electroadhesion gripper 904 comprises an electroadhesion plate 951 with a plurality of electroadhesion zones 956 comprising a plurality of negative pressure ports 967 therein as previously described herein. In some embodiments, each electroadhesion zone 956 comprises a mechanical separation mechanism 970, for example, a netting 965, such that each zone 956 is individuated in such a way that the capture and release modalities of each electroadhesion zone 956 of the capture element 905 are activated independently from every other zone 956. In some embodiments, each zone 956 is individuated in such a way that the capture and release modalities of each electroadhesion zone 956 of the capture element 905 are activated independently from every other zone 956.

FIGS. 10A-10C show exemplary embodiments of an electroadhesion gripper plate 1051 with various patterns for electrode and negative pressure port integration. FIG. 10A shows an embodiment of an electroadhesion plate 1051 or electroadhesion zone 1056 wherein the vacuum ports and electroadhesion electrodes form concentric rings. FIG. 10B shows an embodiment of an electroadhesion plate 1051 or electroadhesion zone 1056 wherein the vacuum ports and electroadhesion electrodes form chains of donuts and squiggles. FIG. 10C shows an embodiment of an electroadhesion plate 1051 or electroadhesion zone 1056 wherein the vacuum ports and electroadhesion electrodes are more traditionally patterned, for example with parallel lines, in a comb pattern, or interdigitated. Other shapes such as hexagons, rectangles, octagons, serpentine patterns, or other geometric shapes are also contemplated. It is contemplated that the ports are in the conductive traces or in the space between traces. A small region without electrodes is optionally provided about the ports to help with HV insulation. The ports for example are all located in the same polarity electrode to help prevent shorting from one polarity to another.

FIG. 11 shows a method 1100 of capturing and releasing a plurality of target objects using an electroadhesion manufacturing system comprising an electroadhesion gripper as described previously herein. The method may use one or more of the systems and apparatus described herein.

At step 1101, the first article component is captured by a first electroadhesion zone and the second article component is capture by a second electroadhesion zone. Capture of the first article component for example comprises one or more of activation of electroadhesion within the first electroadhesion zone (step 1101A) and application of negative pressure at the first electroadhesion zone (step 1101B). Capture of the second article component for example comprises one or more of activation of electroadhesion within the second electroadhesion zone (step 1101A) and application of negative pressure at the second electroadhesion zone (step 1101B). Capture of the first and second article components occurs simultaneously.

At step 1102, the capture of the first article component is detected by a first pressure sensor embedded in the first electroadhesion zone.

At step 1103, the capture of the second article component is detected by a second pressure sensor embedded in the second electroadhesion zone.

At step 1104, the first article component is released from the first electroadhesion zone while the second article component is retained at the second electroadhesion zone. Release of the first article component from the first electroadhesion zone for example comprises one or more of cessation of negative pressure at the first electroadhesion zone (step 1104A), application of positive pressure the first electroadhesion zone (step 1104B), and separation of a netting from the first electroadhesion zone (step 1104C).

At step 1105, release of the first article component is detected by the first pressure sensor.

At step 1106, retention of the second article component is detected by the second pressure sensor.

At step 1107, the second article component is released from the second electroadhesion zone. Release of the second article component from the second electroadhesion zone for example comprises any one or more of the release mechanisms described previously herein.

At step 1108, release of the second article component is detected by the second pressure sensor.

At step 1109, the previous steps are repeated for multiple article components.

Although the steps above show a method 1100 of capturing and releasing a plurality of target objects using an electroadhesion manufacturing system comprising an electroadhesion gripper in accordance with embodiments, a person of ordinary skill in the art will recognize many variations based on the teaching described herein. The steps may be completed in a different order. Steps may be added or deleted. Some of the steps may comprise sub-steps. Many of the steps may be repeated as often as necessary to assemble at least a part of an article.

For example, Step 1102 optionally occurs such that the first and second article components are captured at different times. In many embodiments, additional article components are for example detected and captured simultaneously with the detection and capture of the first and second article components, respectively.

Although the steps above show a method 1100 of capturing and releasing objects in accordance with embodiments, a person of ordinary skill in the art will recognize many variations based on the teaching described herein. The steps may be completed in a different order. Steps may be added or deleted. Some of the steps may comprise sub-steps. Many of the steps may be repeated as often as beneficial.

In many embodiments, one or more of the steps of the method 1100 are performed with circuitry of the various components described herein. In some embodiments, the circuitry is programmed to provide one or more of the steps of the method 1100, and the program comprises program instructions stored on a computer readable memory or programmed steps of the logic in the circuitry.

FIG. 12 shows a method 1200 of manufacturing an article using an electroadhesion manufacturing system comprising an electroadhesion gripper as described previously herein. The method may use one or more of the systems and apparatus described herein.

At step 1201, the capture element is placed over the first article component. Placement of the capture element for example comprises one or more of moving a robotic arm (step 1201A) and aligning the capture element to a first predetermined capture location (step 1201B).

At step 1202, the first article component is captured by the first electroadhesion zone. Capture for example comprises one or more of activation of electroadhesion within the first electroadhesion zone (step 1202A) and application of negative pressure at the first electroadhesion zone (step 1202B). For example, the application of electroadhesion, negative pressure, or the combination thereof is selected based on the type of article component being handled.

At step 1203, the capture element is placed over the second article component. Placement of the capture element for example comprises one or more of moving the robotic arm (step 1203A) and aligning the capture element to a second predetermined capture location (step 1203B).

At step 1204, the second article component is captured by the second electroadhesion zone. Capture for example comprises one or more of activation of electroadhesion within the second electroadhesion zone (step 1204A) and application of negative pressure at the second electroadhesion zone (step 1204B).

At step 1205, the article components are moved to a position over the second platform. Movement of the article components for example comprises one or more of moving the robotic arm (step 1205A) and aligning the capture element to the first predetermined location (step 1205B).

At step 1206, the first article component is released from the first electroadhesion zone while the second article component is retained at the second electroadhesion zone. Release of the first article component from the first electroadhesion zone for example comprises one or more of cessation of negative pressure at the first electroadhesion zone (step 1206A), application of positive pressure the first electroadhesion zone (step 1206B), and separation of a netting from the first electroadhesion zone (step 1206C).

At step 1207, the second article component is released onto the second platform. Release of the second article component from the second electroadhesion zone for example optionally comprises moving the robotic arm to align the capture element with a second predetermined location of the second platform as previously described herein. Release of the second article component from the second electroadhesion zone for example comprises any one or more of the release mechanisms described previously herein.

At step 1208, the previously described steps are repeated for multiple article components.

Although the steps above show a method of manufacturing an article using an electroadhesion manufacturing system comprising an electroadhesion gripper in accordance with embodiments, a person of ordinary skill in the art will recognize many variations based on the teaching described herein. The steps may be completed in a different order. Steps may be added or deleted. Some of the steps may comprise sub-steps. Many of the steps may be repeated as often as necessary to assemble at least a part of an article.

Alternatively or in combination, Steps 1201 and 1203 of positioning the capture element optionally occur simultaneously when the first and second article components have been placed in predetermined capture locations such that Steps 1202 and 1204 are able to be performed simultaneously to capture the first and second article components at the same time. In many embodiments, additional article components are for example captured simultaneously with the capture of the first and second article components, respectively.

Although the steps above show a method 1200 of manufacturing an article in accordance with embodiments, a person of ordinary skill in the art will recognize many variations based on the teaching described herein. The steps may be completed in a different order. Steps may be added or deleted. Some of the steps may comprise sub-steps. Many of the steps may be repeated as often as beneficial.

In many embodiments, one or more of the steps of the method 1200 are performed with circuitry of the various components described herein. In some embodiments, the circuitry is programmed to provide one or more of the steps of the method 1200, and the program comprises program instructions stored on a computer readable memory or programmed steps of the logic in the circuitry.

While preferred embodiments of the present invention have been shown and described herein, it will be obvious to those skilled in the art that such embodiments are provided by way of example only. Numerous variations, changes, and substitutions will now occur to those skilled in the art without departing from the invention. It should be understood that various alternatives to the embodiments of the invention described herein may be employed in practicing the invention. It is intended that the following claims define the scope of the invention and that methods and structures within the scope of these claims and their equivalents be covered thereby.

What is claimed is:

1. A system for manufacturing an article, the system comprising:
a first platform configured to receive the placement of a first article component thereon;
a second platform having a first predetermined location for the first article component;
an electroadhesive capture element, wherein the capture element comprises an electroadhesive plate comprising a planar electroadhesive surface comprising a plurality of electrodes disposed at the planar electroadhesive surface, and wherein a plurality of vacuum ports extend through the electroadhesive plate from a side opposite the planar electroadhesive surface and form openings on the planar electroadhesive surface, and wherein the vacuum ports are coupled to one or more negative pressure sources; and
a robotic actuator coupled to the capture element;
wherein the one or more negative pressure sources apply negative pressure at the side opposite the planar electroadhesive surface to generate negative pressure at the planar electroadhesive surface, and wherein the robotic actuator is configured to move the capture element to the first platform and the electroadhesive capture element is configured to capture with the planar electroadhesive surface the first article component received on the first platform, and wherein the robotic actuator is configured to move the capture element to reposition the captured first article component over the first predetermined location on the second platform, and the capture element is configured to release the first component onto the first predetermined location, whereby the first article component placed on the second platform is oriented for assembly into an article.

2. The system of claim 1, wherein the first platform is configured to receive the placement of a second article component thereon, and wherein the second platform has a second predetermined location for the second article component, and wherein the electroadhesive capture element is configured to capture with the planar electroadhesive surface the second article component received on the first platform, and wherein the robotic actuator is configured to move the capture element to reposition the captured second article component over the second predetermined location on the second platform, and the capture element is configured to release the second article component onto the second predetermined location whereby the second article component placed on the second platform is oriented for assembly into the article with the first article component, and wherein the planar electroadhesive surface comprises a first zone and a second zone, and wherein the first zone is configured for capturing the first article component and the second zone is configured for capturing the second article component.

3. The system of claim 1, wherein the first platform is configured to receive the placement of a second article component thereon, and wherein the second platform has a second predetermined location for the second article component, and wherein the electroadhesive capture element is configured to capture with the planar electroadhesive surface the second article component received on the first platform, and wherein the robotic actuator is configured to move the capture element to reposition the captured second article component over the second predetermined location on the second platform, and the capture element is configured to release the second article component onto the second predetermined location whereby the second article component placed on the second platform is oriented for assembly into the article with the first article component, and wherein the plurality of vacuum ports comprises a first zone of vacuum ports and a second zone of vacuum ports, and wherein the first zone of vacuum ports is configured for capturing the first article component and the second zone of vacuum ports is configured for capturing the second article component, and wherein the first and second zones of vacuum ports are configured to be separately controlled to capture or release one or more of the first and second article components.

4. The system of claim 1, wherein the one or more negative pressure sources comprises one or more of a prismatic or cuboid vacuum distributor, a fan, a pump, a turbine, a venturi, and a propeller.

5. The system of claim 1, wherein the first platform is configured to receive the placement of a second article component thereon, and wherein the second platform has a second predetermined location for the second article component, and wherein the electroadhesive capture element is configured to capture with the planar electroadhesive surface the second article component received on the first platform, and wherein the robotic actuator is configured to move the capture element to reposition the captured second article component over the second predetermined location on the second platform, and the capture element is configured to release the second article component onto the second predetermined location whereby the second article component placed on the second platform is oriented for assembly into the article with the first article component, and wherein the capture element comprises a first zone and a second zone, and wherein the first zone is configured for capturing the first article component and the second zone is configured for capturing the second article component, and wherein the first and second zones are separately mechanically actuated to selectively capture or release one or more of the first and second article components.

6. The system of claim 1, wherein the plurality of ports are positioned in or between the plurality of electrodes.

7. The system of claim 1, wherein the capture element further comprises a housing, wherein the electroadhesive plate is coupled to the housing with the robotic actuator coupled to the housing opposite the electroadhesive plate, and wherein negative pressure is generated at the planar electroadhesive surface through the housing via the one or more negative pressure sources.

8. The system of claim 1, wherein the one or more negative pressure sources are provided on the capture element.

9. A method of manufacturing an article with the aid of the system of claim 1, the method comprising:
capturing a first article component placed on the first platform via electroadhesion and application of negative pressure;
capturing a second article component placed on the first platform via electroadhesion and application of negative pressure, wherein capturing the first and second article components via electroadhesion comprises placing the planar electroadhesive surface of the electroadhesive capture element over the first and second article components and activating the planar electroadhesive surface;
moving the captured first and second article components to a position over the second platform;
releasing the captured first article component to place the first article component on the first predetermined location of the second platform; and
releasing the captured second article component to place the second article component on a second predetermined location of the second platform,
wherein the first and second article components placed on the second platform are assembled into at least a portion of the article.

10. The method of claim 1, wherein the planar electroadhesive surface comprises a first zone for capturing the first article component and a second zone for capturing the second article component.

11. The method of claim 1, wherein one or more of the capture element and the first platform comprises a first vacuum source for capturing the first article component and a second vacuum source for capturing the second article component.

12. The method of claim 1, wherein one or more of the first and second article components comprises a textile piece, a shoe part, an automotive part, a machinery part, or a circuitry part, and wherein the article comprises, respectively, at least a portion of an article of clothing, at least a portion of a shoe, at least a portion of a machine, or at least a portion of a circuit.

* * * * *

UNITED STATES PATENT AND TRADEMARK OFFICE
CERTIFICATE OF CORRECTION

| | |
|---|---|
| PATENT NO. | : 11,203,123 B2 |
| APPLICATION NO. | : 16/030707 |
| DATED | : December 21, 2021 |
| INVENTOR(S) | : Harsha Prahlad et al. |

It is certified that error appears in the above-identified patent and that said Letters Patent is hereby corrected as shown below:

In the Claims

Column 28
Claim 10, Line 42, "claim 1" should be --claim 9--
Claim 11, Line 46, "claim 1" should be --claim 9--
Claim 12, Line 51, "claim 1" should be --claim 9--

Signed and Sealed this
Nineteenth Day of March, 2024

Katherine Kelly Vidal
*Director of the United States Patent and Trademark Office*